United States Patent
Hong et al.

(10) Patent No.: US 12,406,948 B2
(45) Date of Patent: Sep. 2, 2025

(54) DISPLAY APPARATUS HAVING DISPLAY MODULE AND MANUFACTURING METHOD THEREOF

(71) Applicant: SAMSUNG ELECTRONICS CO., LTD., Suwon-si (KR)

(72) Inventors: Soonmin Hong, Suwon-si (KR); Tackmo Lee, Suwon-si (KR); Gunwoo Kim, Suwon-si (KR); Seonghwan Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 449 days.

(21) Appl. No.: 18/095,281

(22) Filed: Jan. 10, 2023

(65) Prior Publication Data

US 2023/0282602 A1  Sep. 7, 2023

Related U.S. Application Data

(63) Continuation of application No. PCT/KR2022/021543, filed on Dec. 28, 2022.

(30) Foreign Application Priority Data

Feb. 3, 2022 (KR) .......... 10-2022-0014450
Mar. 17, 2022 (KR) .......... 10-2022-0033440

(51) Int. Cl.
  *H01L 23/60* (2006.01)
  *H01L 23/00* (2006.01)
  (Continued)

(52) U.S. Cl.
  CPC .......... *H01L 23/60* (2013.01); *H01L 23/3192* (2013.01); *H01L 25/167* (2013.01);
  (Continued)

(58) Field of Classification Search
  CPC ... H01L 23/60; H01L 23/3192; H01L 25/167; H05K 5/30; H05K 5/04
  See application file for complete search history.

(56) References Cited

U.S. PATENT DOCUMENTS 11,238,818 B2  2/2022  Kim et al.
11,392,004 B2  7/2022  Okazaki et al.
(Continued)

FOREIGN PATENT DOCUMENTS

EP  4 202 891 A1  6/2023
EP  4 358 164 A1  4/2024
(Continued)

OTHER PUBLICATIONS

Communication dated Dec. 20, 2024, issued by European Patent Office in European Patent Application No. 22925130.1.
(Continued)

*Primary Examiner* — Mary Ellen Bowman
(74) *Attorney, Agent, or Firm* — Sughrue Mion, PLLC

(57) ABSTRACT

A display module includes: a substrate having a mounting surface, four side surfaces, and a rear surface opposite to the mounting surface, the substrate including a thin film transistor layer (TFT) provided on the mounting surface; a plurality of inorganic light-emitting diodes provided on the mounting surface of the substrate; a side wiring electrically connected to the TFT layer and extending along a first pair of side surfaces among the four side surfaces of the substrate; a front cover covering the TFT layer and the plurality of inorganic light emitting devices in a first direction; a metal plate provided on the rear surface of the substrate; a side cover covering the side wiring and the four side surfaces; and a side member provided on a side of the side cover and grounded to the metal plate, wherein the side member is provided on a first side surface of the first pair of
(Continued)

side surfaces along which the side wiring extends among the four side surfaces.

15 Claims, 12 Drawing Sheets

(51) Int. Cl.
  *H01L 23/31* (2006.01)
  *H01L 25/16* (2023.01)
  *H05K 5/04* (2006.01)
  *H05K 5/30* (2025.01)
  *H10D 86/40* (2025.01)
  *H10D 86/60* (2025.01)

(52) U.S. Cl.
  CPC ............... *H05K 5/04* (2013.01); *H05K 5/30* (2025.01); *H01L 24/29* (2013.01); *H01L 24/32* (2013.01); *H01L 24/33* (2013.01); *H01L 2224/29028* (2013.01); *H01L 2224/32145* (2013.01); *H01L 2224/32245* (2013.01); *H01L 2224/33181* (2013.01); *H01L 2924/12041* (2013.01); *H10D 86/441* (2025.01); *H10D 86/60* (2025.01)

(56) References Cited

U.S. PATENT DOCUMENTS

| | | | |
|---|---|---|---|
| 11,626,468 B2 | 4/2023 | Kwon et al. | |
| 12,278,226 B2 * | 4/2025 | Hong | H10H 29/142 |
| 2020/0350476 A1 * | 11/2020 | Lee | G09F 9/3026 |
| 2021/0050498 A1 | 2/2021 | Lee et al. | |
| 2021/0074789 A1 * | 3/2021 | Hwang | G02F 1/136204 |
| 2021/0142748 A1 | 5/2021 | Kim et al. | |
| 2021/0183837 A1 * | 6/2021 | Shin | G02F 1/13336 |
| 2022/0084994 A1 * | 3/2022 | Shin | H10H 20/857 |
| 2023/0027649 A1 * | 1/2023 | Hong | G09F 9/33 |
| 2023/0090105 A1 * | 3/2023 | Shin | H01L 25/0753 257/91 |
| 2023/0155059 A1 * | 5/2023 | Lee | G02F 1/1362 257/79 |
| 2023/0299251 A1 | 9/2023 | Hong et al. | |

FOREIGN PATENT DOCUMENTS

| | | |
|---|---|---|
| KR | 10-2020-0004174 A | 1/2020 |
| KR | 10-2020-0036029 A | 4/2020 |
| KR | 10-2020-0127815 A | 11/2020 |
| KR | 10-2180807 B1 | 11/2020 |
| KR | 10-2021-0019804 A | 2/2021 |
| KR | 10-2021-0098981 A | 8/2021 |
| KR | 10-2289831 B1 | 8/2021 |
| KR | 10-2021-0141146 A | 11/2021 |
| KR | 10-2023-0060347 A | 5/2023 |
| KR | 10-2023-0135889 A | 9/2023 |

OTHER PUBLICATIONS

International Search Report (PCT/ISA/210) issued Apr. 27, 2023 by the International Searching Authority in International Application No. PCT/KR2022/021543.
Written Opinion (PCT/ISA/237) issued Apr. 27, 2023 by the International Searching Authority in International Application No. PCT/KR2022/021543.

* cited by examiner

DISPLAY APPARATUS HAVING DISPLAY MODULE AND MANUFACTURING METHOD THEREOF

CROSS-REFERENCE TO RELATED APPLICATION

This application is a continuation application of International Application No. PCT/KR2022/021543, filed on Dec. 28, 2022, which is based on and claims priority to Korean Patent Applications No. 10-2022-0014450, filed on Feb. 3, 2022, and Korean Patent Application No. 10-2022-0033440, filed on Mar. 17, 2022, in the Korean Intellectual Property Office, the disclosures of which are incorporated by reference herein in their entireties.

BACKGROUND

1. Field

The disclosure relates to a display apparatus for displaying an image by coupling modules in which self-emissive inorganic light-emitting diodes are mounted on a substrate.

2. Description of Related Art

A display apparatus is an output apparatus for visually displaying images and data information, such as characters, figures, etc.

In general, as a display apparatus, a liquid crystal panel including a backlight or an organic light-emitting diode (OLED) panel configured with an organic compound film itself emitting light in response to current has been widely used. However, the liquid crystal panel has a slow response time and high power consumption, and requires a backlight because it does not emit light by itself. Accordingly, it is difficult to reduce the size of the liquid crystal panel. Also, the OLED panel does not require a backlight and may implement a thin thickness because it emits light by itself. However, the OLED panel is vulnerable to a burn-in phenomenon in which, when the OLED panel displays the same screen for a long time, a certain area of the screen remains the same even after the screen changes to another screen due to short life cycles of sub pixels. For these reasons, as a new panel for replacing the light crystal panel and the OLED panel, a micro light-emitting diode (micro LED or μLED) panel in which inorganic light-emitting diodes are mounted on a substrate and the inorganic light-emitting diodes themselves are used as pixels is being studied.

The micro light-emitting diode panel (hereinafter, referred to as a micro LED panel) is a flat display panel is configured with a plurality of inorganic LEDs each having a size of 100 micrometers or less.

The micro LED panel does not cause the burn-in phenomenon of OLEDs as inorganic light-emitting diodes although the micro LED panel is a self-emissive light-emitting device, and the micro LED panel is excellent in view of brightness, resolution, consumption power, and durability.

The micro LED panel provides higher contrast, a faster response time, and higher energy efficiency compared to LCD panels requiring backlights. Micro LEDs have better brightness, light-emitting efficiency, and life cycle than OLEDs, although both the organic LEDs and the micro LEDs as inorganic light-emitting diodes have high energy efficiency.

Also, by arranging LEDs in units of pixels on a circuit board, substrate level display modularization is possible, and various resolutions and screen sizes may be implemented according to consumers' orders.

SUMMARY

Provided are a display apparatus and a manufacturing method thereof, and provide a technical feature related to electrostatic protection for a display module suitable for enlargement and a display apparatus including the display module.

Additional aspects of the disclosure will be set forth in part in the description which follows and, in part, will be apparent from the description, or may be learned by practice of the presented embodiments.

According to an aspect of the disclosure, a display module includes: a substrate having a mounting surface on which a plurality of inorganic light-emitting diodes are mounted and a TFT layer is formed, four side surfaces, and a rear surface being opposite to the mounting surface; a side wiring electrically connected to the TFT layer and extending along a first pair of side surfaces among the four side surfaces of the substrate; a front cover covering the TFT layer and the plurality of inorganic light emitting devices in a first direction; a metal plate provided on the rear surface of the substrate; a side cover covering the side wiring and the four side surfaces; and a side member provided on a side of the side cover and grounded to the metal plate, wherein the side member is provided on a first side surface of the first pair of side surfaces along which the side wiring extends among the four side surfaces.

The side member may include a first side member provided on the first side surface of the first pair of side surfaces along which the side wiring extends, and a second side member provided on a second side surface of a second pair of side surface along which the side wiring does not extend among the four side surfaces.

The first side member and the second side member may be integrally formed as one body and extend along the first side surface and the second side surface.

The side wiring may extend along the four side surfaces, and the side member is provided on the first side surface of the first pair of side surfaces and a second side surface of a second pair of side surfaces among the four side surfaces.

The side member positioned on the first side surface and the second side surface may be integrally formed as one body.

A conductivity of the side member may be is greater than a conductivity of the side cover.

A color of the side member may be black.

The side member may include a metal material.

According to an aspect of the disclosure a display apparatus includes: a plurality of display modules are arranged in an M*N matrix form; and a frame configured to support the plurality of display modules, wherein each display module of the plurality of display modules includes: a substrate having a mounting surface, four side surfaces, and a rear surface opposite to the mounting surface on which a plurality of inorganic light-emitting diodes are mounted and a TFT layer is formed, four side surfaces, and a rear surface being opposite to the mounting surface; a side wiring electrically connected with the TFT layer and extending along a first pair of side surfaces among the four side surfaces; a front cover covering the plurality of inorganic light-emitting diodes and the TFT layer in a first direction; a metal plate provided on the rear surface; a side cover covering the side wiring and the four side surfaces; and a side member provided on a side of the side cover and grounded to the metal plate, and wherein the side member is positioned on a first side surface of the first pair of side surfaces along which the side wiring extends among the four side surfaces.

The plurality of display modules may include a first display module and a second display module that is adjacent to the first display module in a direction in which the side wiring of the first display module is extends, and the side member of the first display module may contact a second side surface of the second display module among the first pair of side surfaces along which the side wiring of the second display module extends, and the side member of the second display module is not provided on the second side surface of the second display module.

The first display module may be positioned such that a second side surface among the first pair of side surfaces along which the side wiring extends is adjacent to an edge of the frame, and the side member is not positioned on the second side surface, and the frame may include a frame side member that surrounds the second side surface of the first display module among the first pair of side surfaces along which the side wiring extends.

The frame side member may extend along the edge of the frame.

The side member may include a first side member provided on the first side surface of the first pair of side surfaces along which the side wiring extends, and a second side member provided on a second side surface of a second pair of side surface along which the side wiring does not extend among the four side surfaces.

The first side member and the second side member may be integrally formed as one body and extend along the first side surface and the second side.

Each display module of the plurality of display modules may be positioned such that side surfaces on which neither the first side member nor the second side member are positioned, among the four side surfaces, are respectively adjacent to edges of the frame, and the frame may include a frame side member that surrounds the side surfaces of the each display module of the plurality of display modules, on which neither the first side member nor the second side member are provided.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
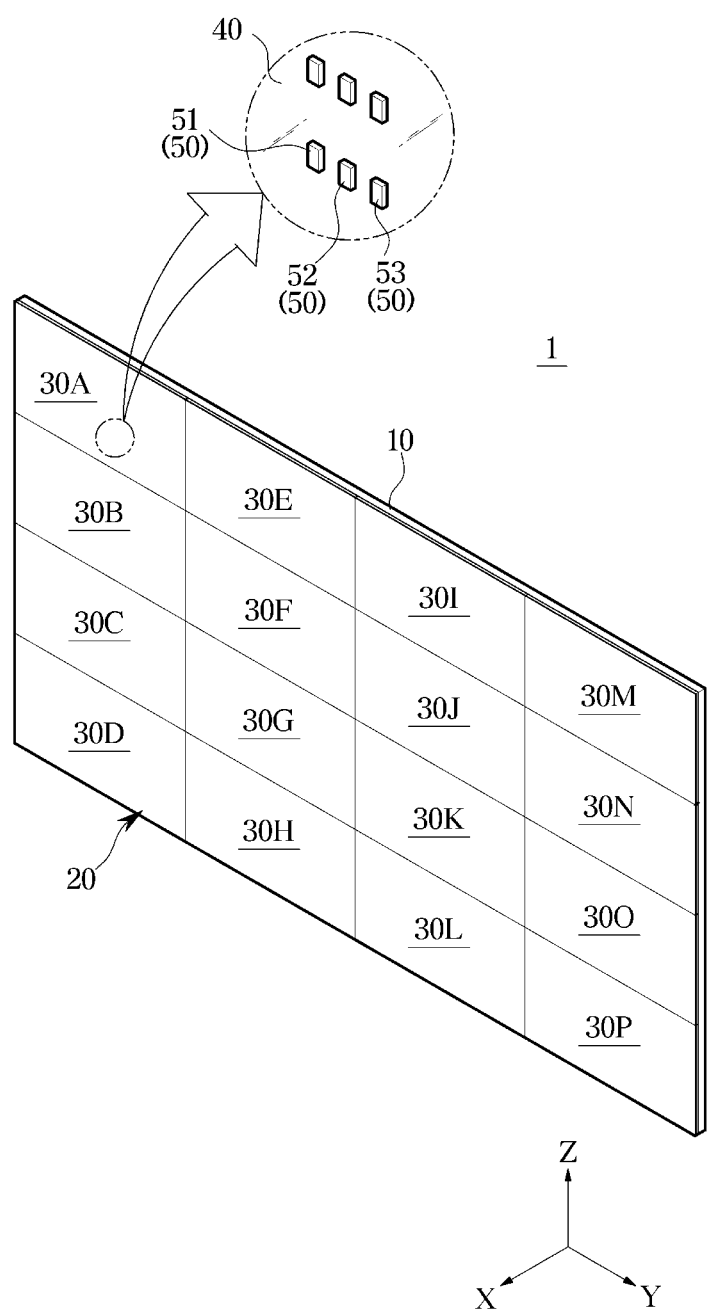
FIG. 1 shows a display apparatus according to an embodiment of the disclosure.

Embodiments described in the present specification are only examples of the disclosure, and thus it is to be understood that various equivalents or modified examples, are included in the scope of present disclosure.

It is to be understood that the singular forms 'a,' 'an,' and 'the' used in the following description include plural referents unless the context clearly dictates otherwise. In the drawings, for easy understanding, the shapes, sizes, etc. of components are more or less exaggeratedly shown.

It will be understood that when the terms 'includes,' 'comprises,' 'including,' and/or 'comprising,' when used in this specification, specify the presence of stated features, figures, steps, operations, components, members, or combinations thereof, but do not preclude the presence or addition of one or more other features, figures, steps, operations, components, members, or combinations thereof.

Also, the meaning of 'identical' in the present specification includes being similar in attributes or being similar within a certain range. Also, 'identical' means 'substantially identical'. The meaning of 'substantially identical' should be interpreted that a value falling within a manufacturing error range or a value corresponding to a difference falling within a meaningless range with respect to a reference value is included in the range of 'identical'.

Throughout the disclosure, the expression "at least one of a, b or c" indicates only a, only b, only c, both a and b, both a and c, both b and c, all of a, b, and c, or variations thereof.

Hereinafter, example embodiments of the disclosure will be described with reference to the accompanying drawings.

Figure 2:
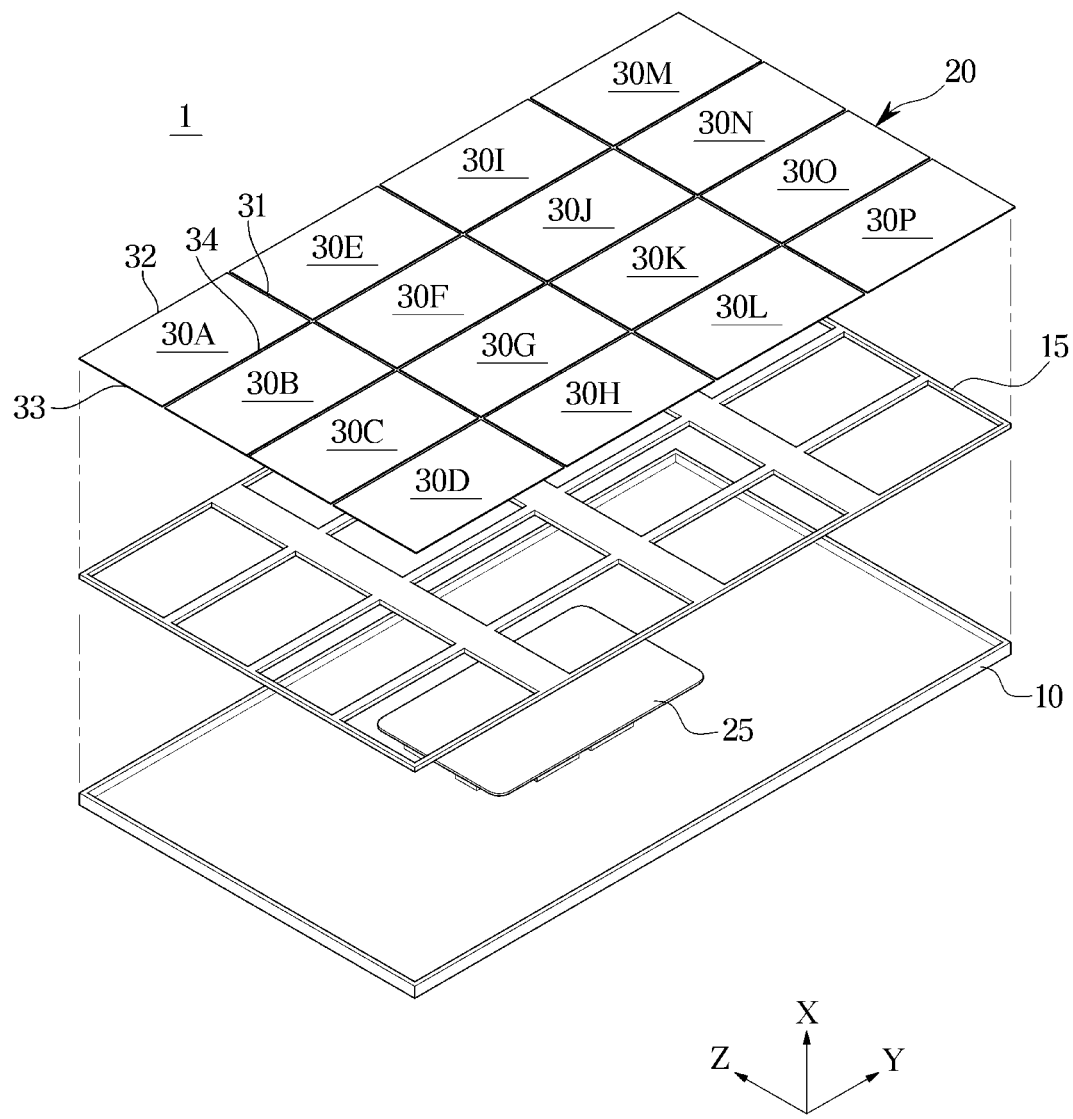
FIG. 2 is an exploded view showing main components of the display apparatus of FIG. 1.
Figure 3:
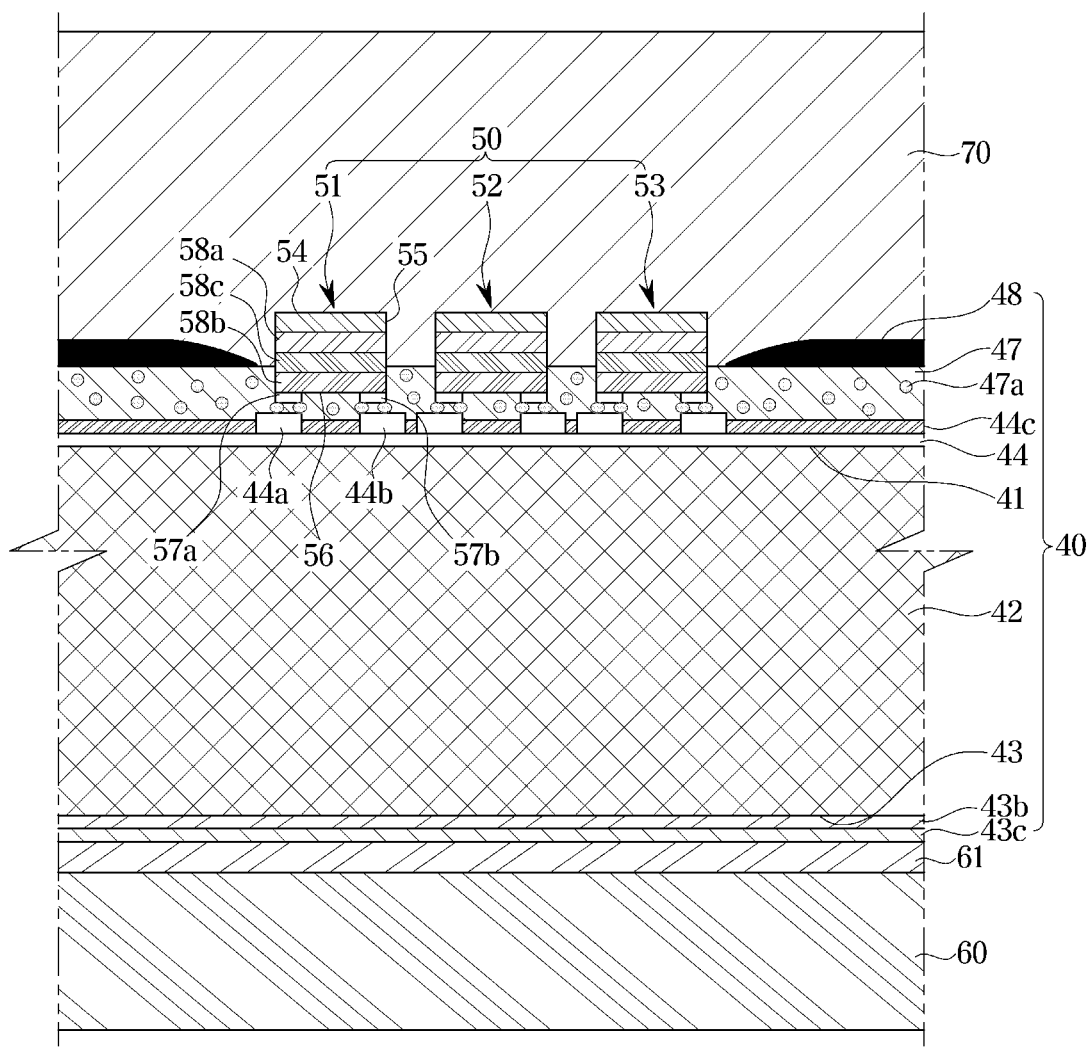
FIG. 3 is an enlarged cross-sectional view of some components of a display module shown in FIG. 1.
Figure 4:
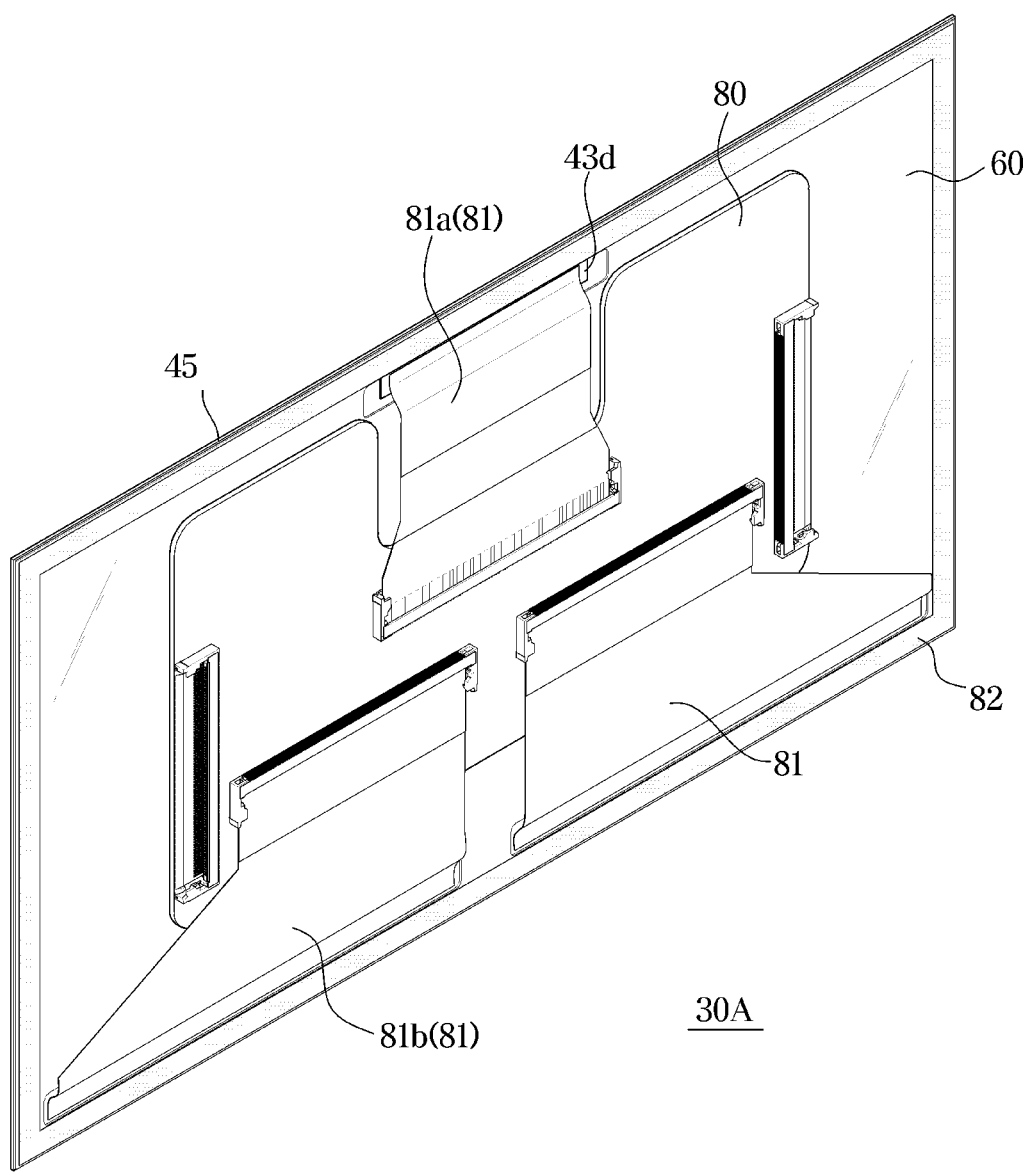
FIG. 4 is a rear perspective view of a display module of the display apparatus shown in FIG. 1.
Figure 5:
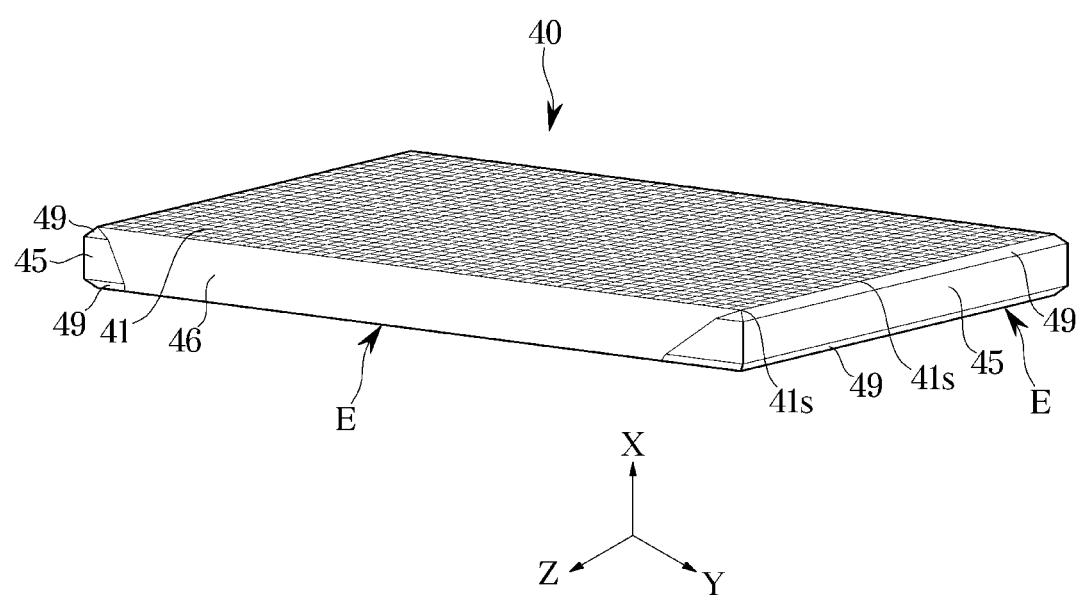
FIG. 5 is a perspective view of some components of the display module shown in FIG. 1.

FIG. 1 shows a display apparatus according to an embodiment of the disclosure, FIG. 2 is an exploded view showing main components of the display apparatus of FIG. 1, FIG. 3 is an enlarged cross-sectional view of some components of a display module shown in FIG. 1, FIG. 4 is a rear perspective view of a display module of the display apparatus shown in FIG. 1, and FIG. 5 is a perspective view of some components of the display module shown in FIG. 1.

Components of a display apparatus 1 including a plurality of inorganic light-emitting diodes 50 shown in the drawings are components in micro-units having a size of several μm to several hundreds of micrometers (μm), and the sizes of some components (the plurality of inorganic light-emitting diodes 50, a black matrix 48, etc.) shown in the drawings are exaggerated for convenience of description.

The display apparatus 1 is a device that displays information, material, data, etc. as characters, figures, graphs, images, etc., and may be implemented as a television (TV), a personal computer (PC), a mobile, a digital signage, etc.

According to an embodiment of the disclosure, as shown in FIGS. 1 and 2, the display apparatus 1 may include a display panel 20 for displaying an image, a power supply for supplying power to the display panel 20, a main board 25 for controlling overall operations of the display panel 20, a frame 15 supporting the display panel 20, and a rear cover 10 covering a rear surface of the frame 15.

The display panel 20 may include a plurality of display modules 30A to 30P, a driving board for driving the individual display modules 30A to 30P, and a Timing Controller (TCON) board for generating timing signals required for controlling the individual display modules 30A to 30P.

The rear cover 10 may support the display panel 20. The rear cover 10 may be mounted on the floor through a stand, or may be mounted on a wall through a hanger.

The plurality of display modules 30A to 30P may be arranged in upper to lower directions and left to right directions to be adjacent to each other. The plurality of display modules 30A to 30P may be arranged in an M×N matrix. In the current embodiment, sixteen display modules 30A to 30P are arranged in a 4×4 matrix form, but there is no limitation on the number and arrangement of the plurality of display modules 30A to 30P.

For example, the plurality of display modules 30A to 30P according to an embodiment of the disclosure may include a first display module 30A positioned at an uppermost and leftmost location. The plurality of display modules 30B to 30P may be arrayed in a right direction or a down direction with respect to the first display module 30A.

The plurality of display modules 30A to 30P may be mounted on the frame 15 through various known methods, such as magnetism using a magnet, a mechanical insertion structure, etc. The rear cover 10 may be coupled with a rear side of the frame 15, and the rear cover 10 may form a rear outer appearance of the display apparatus 1.

The rear cover 10 may include a metal material. Accordingly, heat generated from the plurality of display modules 30A to 30P and the frame 15 may be easily transferred to the rear cover 10 to raise heat-radiating efficiency of the display apparatus 1.

As such, the display apparatus 1 according to an embodiment of the disclosure may implement a large screen by tiling the plurality of display modules 30A to 30P.

Alternatively, each of the plurality of display modules 30A to 30P may be applied to a display apparatus. That is, the display modules 30A to 30P may be, in unit of a single piece, installed in and applied to a wearable device, a portable device, or various electronic products or electric parts requiring displays. Also, like the embodiment of the disclosure, the display modules 30A to 30P may be applied to a display device, such as a PC monitor, a high-resolution TV, a signage, an electronic display, etc., by being assembled and arranged in a matrix form.

The plurality of display modules 30A to 30P may have the same configuration. Accordingly, the following description about any one display module will be applied in the same way to all the other display modules.

Hereinafter, because the plurality of display modules 30A to 30P have the same configuration, the plurality of display modules 30A to 30P will be described based on the first display module 30A.

That is, to avoid redundant descriptions, the configuration of the plurality of display modules 30A to 30P will be described by representatively using a display module 30, a substrate 40, and a front cover 70.

Also, the first display module 30A, a third display module 30E neighboring the first display module 30A in a second direction Y, or a second display module 30B neighboring the first display module 30A in a third direction Z among the plurality of display modules 30A to 30P will be described as necessary.

Also, a fifth display module 30I neighboring the third display module 30E in the second direction Y and being opposite to the first display module 30A with respect to the third display module 30E, a seventh display module 30M neighboring the fifth display module 30I and being opposite to the third display module 30E with respect to the fifth display module 30I, a fourth display module 30C neighboring the second display module 30B in the third direction Z and being opposite to the first display module 30A with respect to the second display module 30B, and a sixth display module 30D neighboring the fourth display module 30C in the third direction Z and being opposite to the second display module 30B with respect to the fourth display module 30C will be described as necessary.

The first display module 30A among the plurality of display modules 30A to 30P may be formed, for example, in a quadrangle type. The first display module 30A may be provided in a rectangle type or a square type.

Accordingly, the first display module 30A may include edges 31, 32, 33, and 34 positioned in upper, lower, left, and right directions with respect to a first direction X which is a front direction.

As shown in FIG. 3, each of the plurality of display modules 30A to 30P may include a substrate 40 and a plurality of inorganic light-emitting diodes 50 mounted on the substrate 40. The plurality of inorganic light-emitting diodes 50 may be mounted on a mounting surface 41 of the substrate 40 toward the first direction X. In FIG. 3, for convenience of description, a thickness of the substrate 40 in the first direction X is exaggerated.

The substrate 40 may be formed in a quadrangle type. As described above, each of the plurality of display modules 30A to 30P may be provided in a quadrangle type, and the substrate 40 may also be formed in a quadrangle type correspondingly.

The substrate 40 may be provided in a rectangle type or a square type.

Accordingly, the substrate 40 may include four edges E corresponding to the edges 31, 32, 33, and 34 of the first display module 30A, positioned in the upper, lower, left, and right directions with respect to the first direction X which is the front direction (see FIG. 5).

The first display module 30A may include a right edge 31, an upper edge 32, a left edge 33, and a lower edge 34 with respect to the first direction X as the front direction in which a screen of the first display module 30A is displayed. The right edge 31 may be opposite to the left edge 33 in the second direction Y which is a left-right direction, and the upper edge 32 may be opposite to the lower edge 34 in the third direction Z which is an up-down direction.

The substrate 40 may include a substrate body 42, a mounting surface 41 forming one surface of the substrate body 42, a rear surface 43 forming the other surface of the substrate body 42 and being opposite to the mounting surface 41, and a side surface 45 positioned between the mounting surface 41 and the rear surface 43.

The side surface 45 may form a side of the substrate 40 in the second direction Y and the third direction Z that are orthogonal to the first direction X.

The substrate 40 may include a chamfer portion 49 formed between the mounting surface 41 and the side surface 45 and between the rear surface 43 and the side surface 45.

The chamfer portion 49 may prevent the plurality of display modules 30A to 30P from colliding with each other to be damaged upon an arrangement.

Each edge E of the substrate 40 may include the side surface 45 and the chamfer portion 49.

The substrate 40 may include a Thin Film Transistor (TFT) layer 44 formed on the substrate body 42 to drive the inorganic light-emitting diodes 50. The substrate body 42 may include a glass substrate. That is, the substrate 40 may include a Chip On Glass (COG) type substrate. On the substrate 40, a first pad electrode 44a and a second pad electrode 44b may be formed to electrically connect the inorganic light-emitting diodes 50 with the TFT layer 44.

TFTs constituting the TFT layer 44 are not limited to a certain structure or type, and may be configured as various embodiments. That is, the TFTs of the TFT layer 44 according to an embodiment of the disclosure may be implemented as Low Temperature Poly Silicon (LTPS) TFTs, oxide TFTs, Si (poly silicon or a-silicon) TFTs, organic TFTs, or graphene TFTs.

Also, the TFT layer 44 may be replaced with Complementary Metal-Oxide Semiconductor (CMOS) type, n-type MOSFET, or p-type MOSFET transistors in a case in which the substrate body 42 of the substrate 40 is provided as a silicon wafer.

The plurality of inorganic light-emitting diodes 50 may be formed of an inorganic material, and may include inorganic light-emitting diodes each having a size of several μm to tens of μm in width, length, and height. A length of a shorter side of a micro inorganic light-emitting device among the width, length, and height may be 100 μm or less. That is, the inorganic light-emitting diodes 50 may be picked up from a sapphire or silicon wafer and directly transferred onto the substrate 40. The plurality of inorganic light-emitting diodes 50 may be picked up and conveyed through an electrostatic method using an electrostatic head or a stamp method using an elastic polymer material, such as PDMS or silicon, as a head.

Each of the plurality of inorganic light-emitting diodes 50 may be a light-emitting structure including a n-type semiconductor 58a, an active layer 58c, a p-type semiconductor 58b, a first contact electrode 57a, and a second contact electrode 57b.

For example, Any one of the first contact electrode 57a may be electrically connected with the second contact electrode 57b and the n-type semiconductors 58a, and the other one of the first contact electrode 57a may be electrically connected with the p-type semiconductor 58b.

The first contact electrode 57a and the second contact electrode 57b may be positioned horizontally, and may be a flip chip type arranged toward the same direction (an opposite direction of a light-emitting direction).

Each inorganic light-emitting device 50 may have a light-emitting surface 54 positioned toward the first direction X upon being mounted on the mounting surface 41, a side surface 55, and a bottom surface 56 being opposite to the light-emitting surface 54, wherein the first contact electrode 57a and the second contact electrode 57b may be formed on the bottom surface 56.

That is, the first and second contact electrodes 57a and 57b of the inorganic light-emitting device 50 may be positioned on the opposite side of the light-emitting surface 54, that is, in the opposite direction of the light-emitting direction.

The first and second contact electrodes 57a and 57b may face the mounting surface 41 and be electrically connected with the TFT layer 44, wherein the light-emitting surface 54 from which light is emitted may be positioned in the opposite direction of the direction in which the contact electrodes 57a and 57b are positioned.

Accordingly, upon irradiating of light generated from the active layer 58c in the first direction X through the light-emitting surface 54, the light may be radiated toward the first direction X without any interference with the first contact electrode 57a or the second contact electrode 57b.

That is, the first direction X may be defined as a direction in which the light-emitting surface 54 is positioned to irradiate light.

The first contact electrode 57a and the second contact electrode 57b may be electrically connected respectively with the first pad electrode 44a and the second pad electrode 44b formed on the mounting surface 41 of the substrate 40.

The inorganic light-emitting device 50 may be connected directly with the first and second pad electrodes 44a and 44b through a bonding component, such as an anisotropic conductive layer 47 or a solder.

The anisotropic conductive layer 47 may be formed on the substrate 40 to mediate electrical bonding between the first and second contact electrodes 57a and 57b and the first and second pad electrodes 44a and 44b. The anisotropic conductive layer 47 may be formed by attaching an anisotropic conductive adhesive on a protection film, and have a structure in which conductive balls 47a are diffused in an adhesive resin. Each conductive ball 47a may be a conductive sphere surrounded by a thin insulation film, and electrically connect a conductor with another conductor as a result of breaking of the insulation film by pressure.

The anisotropic conductive layer 47 may include an anisotropic conductive film (ACF) being in a film type and an anisotropic conductive paste (ACP) being in a paste type.

According to an embodiment of the disclosure, the anisotropic conductive layer 47 may be provided as an anisotropic conductive film.

Accordingly, the insulating films of the conductive balls 47a may be broken by pressure applied to the anisotropic conductive layer 47 upon mounting of the plurality of inorganic light-emitting diodes 50 onto the substrate 40, and thus, the first and second contact electrodes 57a and 57b of the inorganic light-emitting diodes 50 may be electrically connected with the first and second pad electrodes 44a and 44b of the substrate 40.

However, the plurality of inorganic light-emitting diodes 50 may be mounted on the substrate 40 through a solder, instead of the anisotropic conductive layer 47. After the inorganic light-emitting diodes 50 are arranged on the substrate 40, a reflow process may be performed to bond the inorganic light-emitting diodes 50 with the substrate 40.

The plurality of inorganic light-emitting diodes 50 may include a red light-emitting device 51, a green light-emitting device 52, and a blue light-emitting device 53, and the inorganic light-emitting diodes 50 may be mounted on the mounting surface 41 of the substrate 40 by grouping a series of a red light-emitting device 51, a green light-emitting device 52, and a blue light-emitting device 53 into one unit. The series of the red light-emitting device 51, the green light-emitting device 52, and the blue light-emitting device 53 may form one pixel. In this case, the red light-emitting device 51, the green light-emitting device 52, and the blue light-emitting device 53 may form sub pixels respectively.

The red light-emitting device 51, the green light-emitting device 52, and the blue light-emitting device 53 may be arranged at preset intervals in a line, as in the current embodiment of the disclosure, or may be arranged in another type such as a triangle type.

The substrate 40 may include a light absorbing layer 44c for absorbing external light to improve contrast. The light absorbing layer 44c may be formed on the entire mounting surface 41 of the substrate 40. The light absorbing layer 44c may be formed between the TFT layer 44 and the anisotropic conductive layer 47.

The plurality of display modules 30A to 30P may further include the black matrix 48 formed between the plurality of inorganic light-emitting diodes 50.

The black matrix 48 may function to complement the light absorbing layer 44c formed on the entire mounting surface 41 of the substrate 40. That is, the black matrix 48 may absorb external light such that the substrate 40 is shown to be black, thereby improving contrast of a screen.

The black matrix 48 may have a black color.

In the current embodiment of the disclosure, the black matrix 48 may be positioned between pixels each formed by a series of a red light-emitting device 51, a green light-emitting device 52, and a blue light-emitting device 53. However, unlike the current embodiment of the disclosure, the black matrix 48 may be more delicately formed in such a way as to partition the red light-emitting device 51, the green light-emitting device 52, and the blue light-emitting device 53 that are sub pixels.

The black matrix 48 may be formed in a lattice type having a horizontal pattern and a vertical pattern to be positioned between the pixels.

The black matrix 48 may be formed by applying a light absorbing ink onto the anisotropic conductive layer 47 through an ink-jet process and then hardening the light absorbing ink, or the black matrix 48 may be formed by coating the anisotropic conductive layer 47 with a light absorbing film.

That is, the black matrix 48 may be formed at an area between the plurality of inorganic light-emitting diodes 50 on the anisotropic conductive layer 47 formed on the entire mounting surface 41, wherein none of the plurality of inorganic light-emitting diodes 50 is mounted at the area.

Each of the plurality of display modules 30A to 30P may include a front cover 70 positioned on the mounting surface 41 in the first direction X to cover the mounting surface 41 of the display module 30A to 30P.

Figure 6:
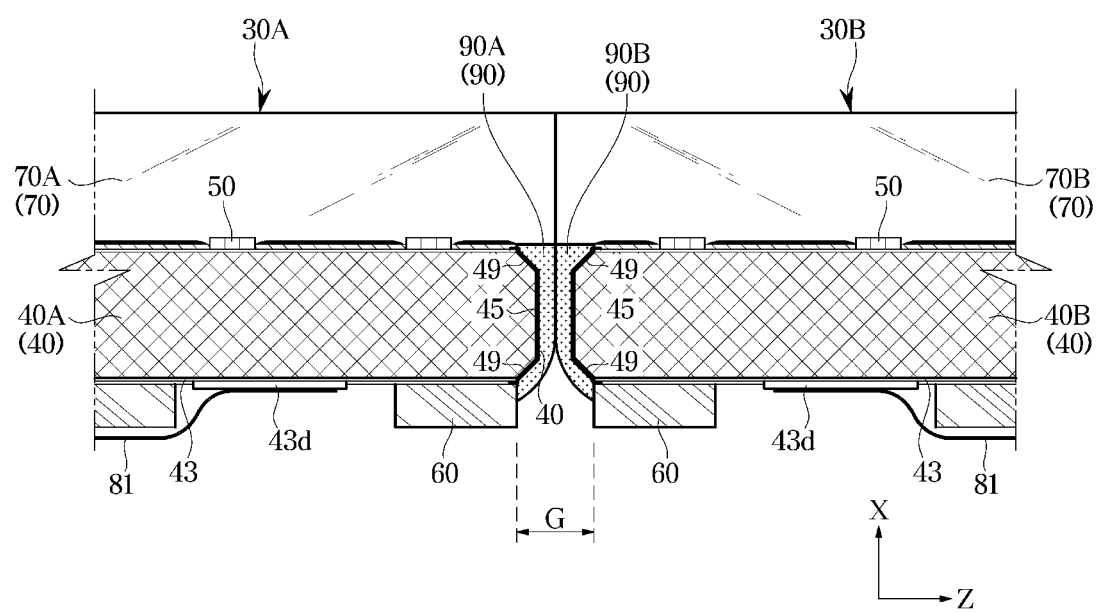
FIG. 6 is a cross-sectional view showing some components of the display apparatus of FIG. 1 in a third direction.
Figure 7:
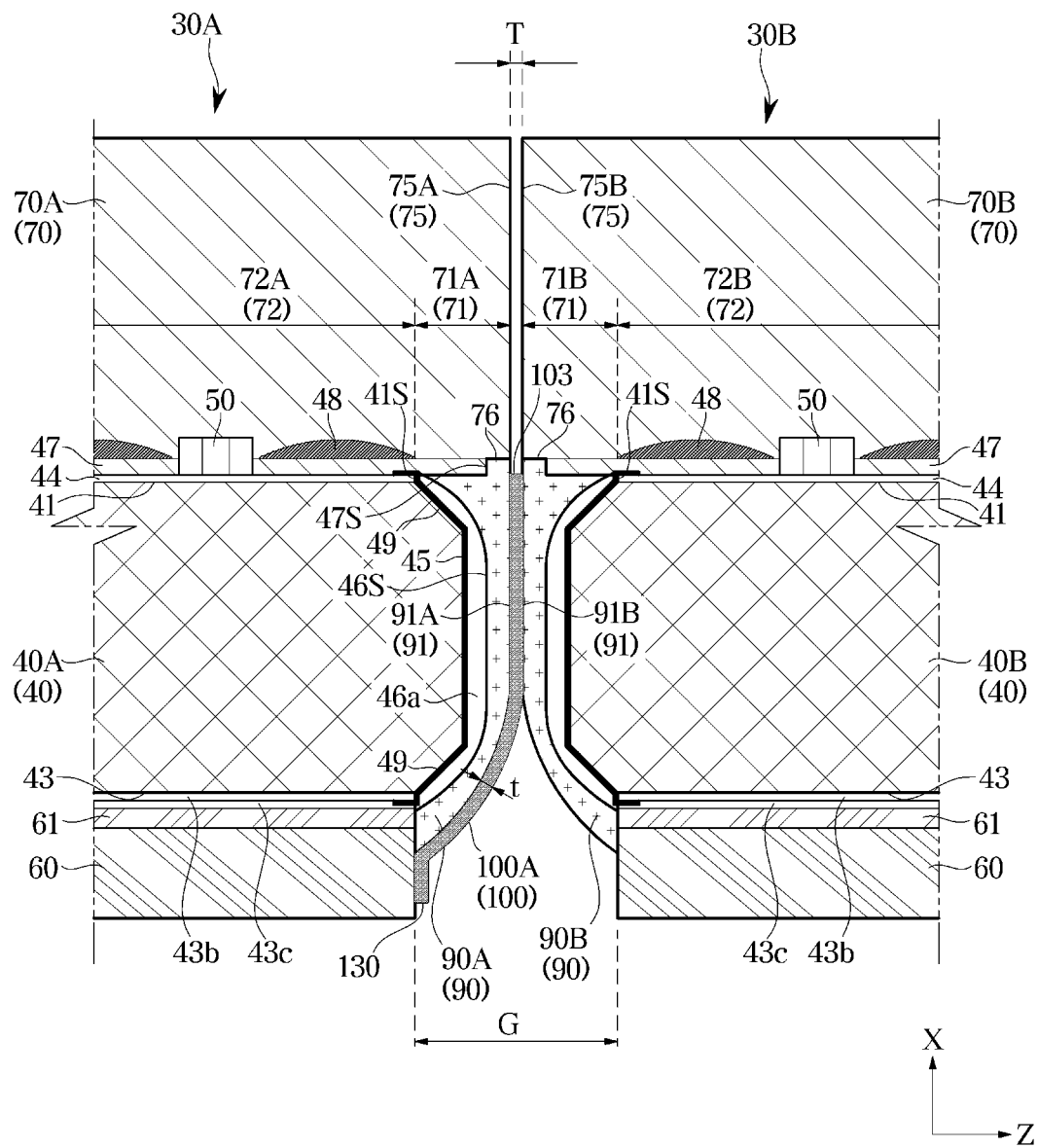
FIG. 7 is an enlarged cross-sectional view of the some components shown in FIG. 6.

A plurality of front covers 70 may be formed respectively on the plurality of display modules 30A to 30P in the first direction X (see FIGS. 6 and 7).

After the individual front covers 70 are formed, the plurality of display modules 30A to 30P may be assembled. That is, in examples of the first display module 30A and the second display module 30B among the plurality of display modules 30A to 30P, a first front cover 70A may be formed on the mounting surface 41 of the first display module 30A, and a second front cover 70B may be formed on the mounting surface 41 of the second display module 30B.

The front cover 70 may cover the substrate 40 to protect the substrate 40 from an external force or external moisture.

A plurality of layers of the front cover 70 may be provided as a functional film having optical performance. Details about this will be described below.

A part of the plurality of layers of the front cover 70 may include a base layer formed with an Optical Clear Resin (OCR). The base layer may support the plurality of other layers. The OCR may be in a very transparent state having transmittance of 90% or more.

The OCR may improve visibility and image quality by raising transmittance through low reflective properties. That is, in a structure having an air gap, light loss may occur by a difference between reflective indexes of a film layer and an air layer, whereas in a structure using an OCR, light loss may be reduced by a small difference between reflective indexes, resulting in an improvement of visibility and image quality.

That is, the OCR may protect the substrate 40 while improving image quality.

In the front cover 70, a part of the plurality of layers may include an adhesive layer for adhering the front cover 70 to the mounting surface 41 of the substrate 40.

The front cover 70 may have a preset height or more in the first direction X which the mounting surface 41 or the light-emitting surface 54 faces.

The reason may be to sufficiently fill up a gap that may be formed between the front cover 70 and the plurality of inorganic light-emitting diodes 50 upon forming of the front cover 70 on the substrate 40.

Each of the plurality of display modules 30A to 30P may include a metal plate 60 positioned on the rear surface 43 of the substrate 40.

Also, each of the plurality of display modules 30A to 30P may include a rear adhesive tape 61 positioned between the rear surface 43 and the metal plate 60 to adhere the metal plate 60 to the rear surface 43 of the substrate 40.

The rear adhesive tape 61 may be a double-sided adhesive tape, although not limited thereto. However, an adhesive layer may be provided instead of a tape. That is, the rear adhesive tape 61 may be an embodiment of a medium for adhering the metal plate 60 to the rear surface 43 of the substrate 40, and may be one of various mediums without being limited to a tape.

The plurality of inorganic light-emitting diodes 50 may be electrically connected with an upper wiring layer extending from a pixel driving wire formed on the mounting surface 41 through the side surface 45 of the substrate 40, the upper wiring layer being formed as a pixel driving wire.

The upper wiring layer may be formed below the anisotropic conductive layer 47. The upper wiring layer may be electrically connected with a side wire 46 formed on the side surface 45 of the substrate 40. The side wire 46 may be provided in a thin film type. The side wire 46 may include a coating member 46a surrounding the side wire 46 to prevent the side wire 46 exposed to outside from being damaged (see FIG. 7).

The side wire 46 may extend to the rear surface 43 of the substrate 40 along the chamfer portion 49 and the side surface 45 of the substrate 40 in the third direction Z. That is, the side wire 46 may extend from the upper edge 32 and the lower edge 34 to the rear surface 43 of the substrate 40 along the chamfer portion 49 and the side surface 45 of the substrate 40.

The upper wiring layer may be connected with the side wire 46 by an upper connecting pad formed at each edge E of the substrate 40.

The side wire 46 may extend along the side surface 45 of the substrate 40 and be connected with a rear wiring layer 43b formed on the rear surface 43.

On the rear wiring layer 43b, an insulating layer 43c may be formed in a direction which the rear surface 43 of the substrate 40 faces to cover the rear wiring layer 43b.

That is, the plurality of inorganic light-emitting diodes 50 may be electrically connected with the upper wiring layer, the side wire 46, and the rear wiring layer 43b sequentially.

Also, as shown in FIG. 4, the display module 30A may include a driving circuit board 80 for electrically controlling the plurality of inorganic light-emitting diodes 50 mounted on the mounting surface 41. The driving circuit board 80 may be a printed circuit board. The driving circuit board 80 may be positioned on the rear surface 43 of the substrate 40 in the first direction X. The driving circuit board 80 may be positioned on the metal plate 60 adhered on the rear surface 43 of the substrate 40.

The display module 30A may include a flexible film 81 connecting the driving circuit board 80 with the rear wiring layer 43b to electrically connect the driving circuit board 80 with the plurality of inorganic light-emitting diodes 50.

More specifically, one end of the flexible film 81 may be connected with a rear connecting pad 43d positioned on the rear surface 43 of the substrate 40 and electrically connected with the plurality of inorganic light-emitting diodes 50.

The rear connecting pad 43d may be electrically connected with the rear wiring layer 43d. Accordingly, the rear connecting pad 43d may electrically connect the rear wiring layer 43b with the flexible film 81.

The flexible film 81 may be electrically connected with the rear connecting pad 43d to transfer power and electrical signals from the driving circuit board 80 to the plurality of inorganic light-emitting diodes 50.

The flexible film 81 may be a Flexible Flat Cable (FFC), a Chip On Film (COF), etc.

The flexible film 81 may include a first flexible film 81a and a second flexible film 81b positioned in the upper and lower directions with respect to the first direction X which is the front direction.

The first and second flexible films 81a and 81b may be positioned in the left and right directions or in at least two directions of the upper, lower, left, and right directions with respect to the first direction X, although not limited thereto.

A plurality of second flexible films 81b may be provided, although not limited thereto. However, the second flexible film 81b may be provided as a single piece, and also, a plurality of first flexible films 81a may be provided.

The first flexible film 81a may transfer a data signal from the driving circuit board 80 to the substrate 40. The first flexible film 81a may be a COF.

The second flexible film 81b may transfer power from the driving circuit board 80 to the substrate 40. The second flexible film 81b may be a FFC.

However, the first and second flexible films 81a and 81b may be formed in reverse.

The driving circuit board 80 may be electrically connected with the main board 25 (see FIG. 2). The main board 25 may be positioned behind the frame 15, and the main board 25 may be connected with the driving circuit board 80 through a cable behind the frame 15.

On a rear surface of the metal plate 60, a fixing member 82 for adhering the display modules 30A to 30P to the frame 15 may be positioned. The fixing member 82 may be a double-sided tape. The metal plate 60 forming a rear side of the display modules 30A to 30P may be adhered directly to the frame 15 by the fixing member 82 such that the display modules 30A to 30P are supported by the frame 15.

As described above, the metal plate 60 may be in contact with the substrate 40. The metal plate 60 may be adhered to the substrate 40 by the rear adhesive tape 61 positioned between the rear surface 43 of the substrate 40 and the metal plate 60.

FIG. 5 shows the substrate 40 from which some components such as the anisotropic conductive layer 47 are omitted for convenience of description. Also, the side wire 46 may include the coating member 46a for protecting the side wire 46 from the outside, and the coating member 46a is omitted for convenience of description.

The metal plate 60 may be formed of a metal material having high heat conductivity. For example, the metal plate 60 may be formed of an aluminum material.

Heat generated from the TFT layer 44 and the plurality of inorganic light-emitting diodes 50 mounted on the substrate 40 may be transferred to the metal plate 60 through the rear adhesive tape 61 along the rear surface 43 of the substrate 40.

Accordingly, heat generated from the substrate 40 may be easily transferred to the metal plate 60 to prevent temperature of the substrate 40 from rising to preset temperature or more.

The plurality of display modules 30A to 30P may be arranged at various locations in a M×N matrix form. The individual display modules 30A to 30P may be movable independently. In this case, each of the display modules 30A to 30P may include the metal plate 60 to maintain a certain level of heat-radiating performance regardless of the locations of the display modules 30A to 30P.

The plurality of display modules 30A to 30P may be arranged in various M×N matrix forms to implement various screen sizes of the display apparatus 1. Accordingly, radiating heat from the individual display modules 30A to 30P by including the metal plate 60 in each of the display modules 30A to 30P as in an embodiment of the disclosure may more improve total heat-radiating performance of the display apparatus 1 than radiating heat through a single metal plate provided for temporary heat radiation.

In a case in which a single metal plate is positioned inside the display apparatus 1, the metal plate may not exist at a location corresponding to a location of some display modules in a front-rear direction while existing at a location where no display module is positioned, resulting in deterioration of heat-radiating efficiency of the display apparatus 1.

That is, all of the individual display modules 30A to 30P may radiate heat through the metal plate 60 positioned in each of the display modules 30A to 30P regardless of the locations, which leads to an improvement of total heat-radiating performance of the display apparatus 1.

The metal plate 60 may be provided in a shape of a quadrangle substantially corresponding to the shape of the substrate 40.

An area of the substrate 40 may be larger than or equal to an area of the metal plate 60. According to a parallel arrangement in first direction X of the substrate 40 and the metal plate 60, the four edges E of the substrate 40 being in a shape of a rectangle may correspond to four edges of the metal plate 60 with respect to centers of the substrate 40 and the metal plate 60, or the four edges E of the substrate 40 may be positioned at outer locations than the four edges of the metal plate 60 with respect to the centers of the substrate 40 and the metal plate 60.

The four edges E of the substrate 40 may be positioned at the outer locations than the four edges of the metal plate 60. That is, the area of the substrate 40 may be larger than the area of the metal plate 60.

Upon transferring of heat to the individual display modules 30A to 30P, the substrate 40 and the metal plate 60 may be heat-expanded, wherein a degree of expansion of the metal plate 60 may be greater than a degree of expansion of the substrate 40 because the metal plate 60 has a greater coefficient of thermal expansion than the substrate 40.

In a case in which the four edges E of the substrate 40 correspond to the four edges or the metal plate 60 or are positioned at inner locations than the four edges of the metal plate 60, the edges of the metal plate 60 may protrude outward from the substrate 40.

As a result, lengths of gaps formed between the display modules 30A to 30P may become non-uniform by thermal expansion of the metal plate 60 of each of the display modules 30A to 30P, and accordingly, recognition of some seams may rise, which deteriorates a sense of unity of a screen of the display panel 20.

However, in a case in which the four edges E of the substrate 40 are positioned at the outer locations than the four edges of the metal plate 60, the metal plate 60 may not protrude outward from the four edges E of the substrate 40 although the substrate 40 and the metal plate 60 are heat-expanded, and accordingly, the lengths of the gaps formed between the display modules 30A to 30P may be maintained uniform.

According to an embodiment of the disclosure, the area of the substrate 40 may substantially correspond to the area of the metal plate 60. Accordingly, heat generated from the substrate 40 may be radiated uniformly throughout the entire area of the substrate 40 without being isolated at some areas.

The metal plate 60 may be adhered to the rear surface 43 of the substrate 40 by the rear adhesive tape 61.

The rear adhesive tape 61 may have a size corresponding to the metal plate 60. That is, an area of the rear adhesive tape 61 may correspond to the area of the metal plate 60. The metal plate 60 may be substantially in a shape of a quadrangle, and the rear adhesive tape 61 may be in a shape of a quadrangle correspondingly.

The edges of the metal plate 60 being in a shape of a rectangle may correspond to edges of the rear adhesive tape 61 with respect to centers of the metal plate 60 and the rear adhesive tape 61.

Accordingly, the metal plate 60 and the rear adhesive tape 61 may be easily manufactured as a coupling component, which increases total manufacturing efficiency of the display apparatus 1.

That is, upon cutting of the metal plate 60 into a plurality of units from a plate, the rear adhesive tape 61 may be first adhered to the metal plate 60 before the metal plate 60 is cut, and then, the rear adhesive tape 61 and the metal plate 60 may be cut together into the plurality of units, thereby reducing a number of processes.

Heat generated from the substrate 40 may be transferred to the metal plate 60 through the rear adhesive tape 61. Accordingly, the rear adhesive tape 61 may adhere the metal plate 60 to the substrate 40, while transferring heat generated from the substrate 40 to the metal plate 60.

Accordingly, the rear adhesive tape 61 may include a material having high heat-radiating performance.

Basically, the rear adhesive tape 61 may include an adhesive material to adhere the metal plate 60 to the substrate 40.

In addition, the rear adhesive tape 61 may include a material having higher heat-radiating performance than general adhesive materials. Accordingly, the rear adhesive tape 61 may efficiently transfer heat between the substrate 40 and the metal plate 60.

Also, the adhesive material of the rear adhesive tape 61 may be formed of a material having higher heat-radiating performance than adhesive materials configuring normal adhesives.

The material having the higher heat-radiating material may be a material having high heat conductivity, high heat transfer performance, and low specific heat to effectively transfer heat.

For example, the rear adhesive tape 61 may include a graphite material, although not limited thereto. However, the rear adhesive tape 61 may be any material having high heat-radiating performance.

Flexibility of the rear adhesive tape 61 may be greater than flexibility of the substrate 40 and the metal plate 60. Accordingly, the rear adhesive tape 61 may be a material having adhesiveness, heat-radiating performance, and high flexibility. The rear adhesive tape 61 may be an inorganic material double-sided tape. Because the rear adhesive tape 61 is an inorganic material double-sided tape, as described above, the rear adhesive tape 61 may be formed as a single layer without any material for supporting one surface that is adhered to the substrate 40 and the other surface that is adhered to the metal plate 60.

Because the rear adhesive tape 61 includes no material that interferes with heat transfer, heat-radiating performance may be improved. However, the rear adhesive tape 61 is not limited to an inorganic material double-sided tape, and may be a heat-radiating tape having higher heat-radiating performance than normal double-sided tapes.

The rear adhesive tape 61 may be formed of a material having high flexibility to absorb an external force transferred from the substrate 40 and the metal plate 60. More specifically, the flexibility of the rear adhesive tape 61 may be greater than flexibility of the substrate 40 and the metal plate 60.

Accordingly, upon transferring of an external force generated by a change in size of the substrate 40 and the metal plate 60, caused by heat transferred to the substrate 40 and the metal plate 60, to the rear adhesive tape 61, the rear adhesive tape 61 may itself be deformed to thereby prevent the external force from being transferred to other components.

The rear adhesive tape 61 may have a preset thickness in the first direction X. Upon expanding or contracting of the metal plate 60 by heat transferred to the metal plate 60, the metal plate 60 may be expanded or contracted in a direction that is orthogonal to the first direction X, as well as in the first direction X, and accordingly, an external force may be transferred to the substrate 40.

Because the metal plate 60 is formed with a size corresponding to the substrate 40 to cover the entire rear surface 43 of the substrate 40, as described above, the fixing member 82 may be positioned on the rear surface of the metal plate 60, although not limited thereto.

However, the fixing member 82 may be positioned on the rear surface 43 of the substrate 40. In this case, the substrate 40 may be adhered directly to the frame 15 through the fixing member 82.

Unlike an embodiment of the disclosure, the metal plate 60 may cover a portion of the rear surface 43 of the substrate 40, and the fixing member 82 may be adhered to an area at which the metal plate 60 does not cover the rear surface 43 of the substrate 40.

The fixing member 82 may be a double-sided tape.

Hereinafter, the front cover 70, a side cover 90, and a side member 100 will be described in detail.

Figure 8:
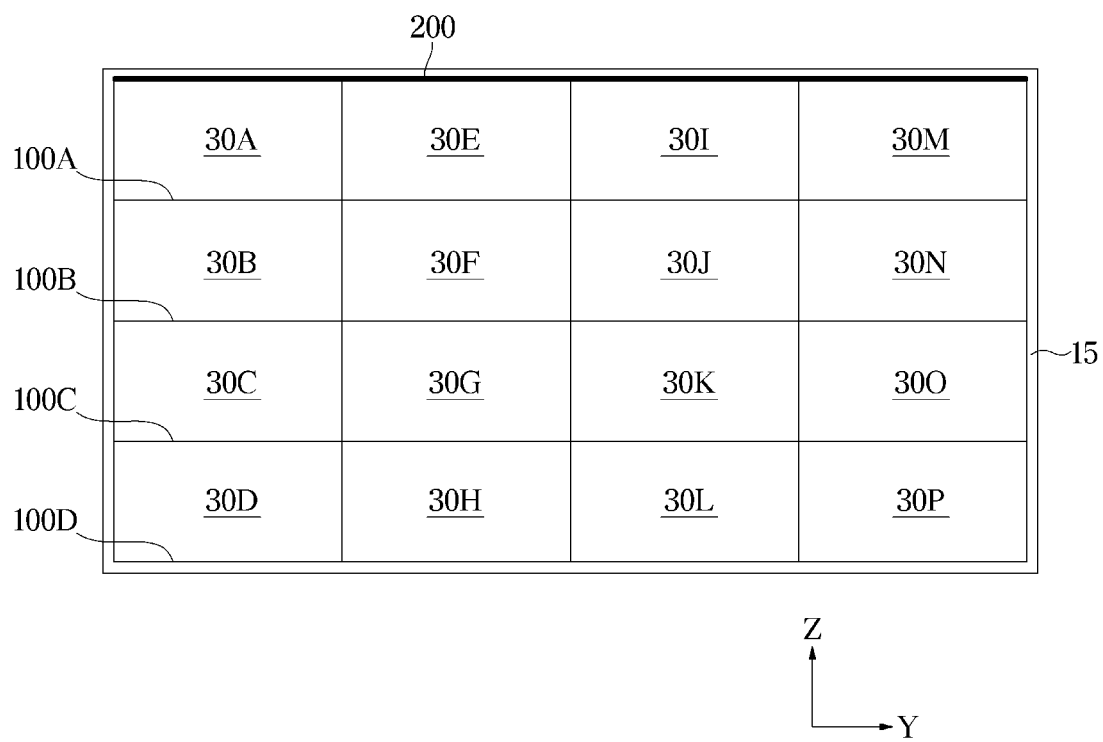
FIG. 8 schematically shows a front side of some components of the display apparatus of FIG. 1.

FIG. 6 is a cross-sectional view showing some components of the display apparatus of FIG. 1 in a third direction, FIG. 7 is an enlarged cross-sectional view of the some components shown in FIG. 6, and FIG. 8 schematically shows a front side of some components of the display apparatus of FIG. 1.

The front cover 70 may protect the substrate 40 from an external force, deteriorate recognition of seams formed by gaps G between the plurality of display modules 30A to 30P, and improve color deviation between the plurality of display modules 30A to 30P.

Each of the plurality of display modules 30A to 30P may include the side cover 90 positioned in a gap G formed between the plurality of display modules 30A to 30P upon an arrangement of the plurality of display modules 30A to 30P.

To absorb light reflected from the gaps G between the plurality of display modules 30A to 30P, the front cover 70 of each of the plurality of display modules 30A to 30P may extend outward from the substrate 40 of each of the plurality of display modules 30A to 30P. A side 75 of the front cover 70 may extend to an outer location than the mounting surface 41.

More specifically, the front cover 70 may extend to an outer location than an edge (side) 41S of the mounting surface 41 of the substrate 40 in the second direction Y and the third direction Z.

Substantially, a gap between the display modules 30A to 30P may be formed between the side surfaces 45 of the substrates 40 of the display modules 30A to 30P, however, according to an embodiment of the disclosure, a gap G may be a non-display area that may be formed between the display modules 30A to 30P. Therefore, the gap G formed between the plurality of display modules 30A to 30P may be interpreted to be a spacing formed between an edge 41S of a mounting surface 41 of a substrate 40 of a display module 30A to 30P and an edge 41S of a mounting surface 41 of a substrate 40 of another display module 30A to 30P neighboring the corresponding display module 30A to 30P.

Accordingly, the gap G formed between the plurality of display modules 30A to 30P may be a spacing formed between the edge 41S of the mounting surface 41 of the display module 30A to 30P and the edge 41S of the mounting surface 41 of the other display module 30A to 30P neighboring the corresponding display module 30A to 30P in the second direction Y or the third direction Z.

In the gap G between the plurality of display modules 30A to 30P, the front cover 70 extending from each of the display modules 30A to 30P may be positioned to absorb light radiated to the gap G or light reflected in the gap G, thereby reducing recognition of seams.

Also, the side cover 90 of each of the plurality of display modules 30A to 30P, the side cover 90 positioned in the gap G, may absorb light radiated to the gap G, thereby reducing visibility of seams, which will be described below.

As shown in FIGS. 6 and 7, the front cover 70 may extend to an outer location than the substrate 40 in the third direction Z. More specifically, the front cover 70 may extend to an outer location than the side surface 45 and the chamfer portion 49 in the third direction Z.

According to an embodiment of the disclosure, one edge of the substrate 40, corresponding to the lower edge 34 of the first display module 30A will be described, however, the front cover 70 may extend to an outer location than the four edges E of the substrate 40 in the second direction Y or the third direction Z.

That is, the side 75 of the front cover 70, corresponding to an edge of the front cover 70, may extend to an outer location of the substrate 40, more specifically, the mounting surface 41 than the four edges E of the substrate 40 in the second direction Y or the third direction Z.

The front cover 70 may include a plurality of layers having different optical properties. The plurality of layers may have a structure resulting from stacking layers in the first direction X.

The plurality of layers may be bonded in the first direction X to constitute the front cover 70.

A layer among the plurality of layers may be an anti-glare layer, although not limited thereto. However, the layer may be an anti-reflective layer or a combination of an anti-glare layer and an anti-reflective layer.

Another layer among the plurality of layers may be a transmission rate adjusting layer, although not limited thereto. However, the other layer may be a layer having another physical property, another material, or another function. For example, the other layer may be a circularly polarized layer.

Alternatively, in another embodiment, a single layer may be used instead of the plurality of layers. The single layer may be a layer capable of functionally implementing all functions of the plurality of layers.

The front cover 70 may include an adhesive layer as described above. The adhesive layer may be positioned at a lowermost location of the plurality of layers in the first direction X and adhered to the mounting surface 41. The adhesive layer may have a preset height or more in the first direction X which the mounting surface 41 or the light-emitting surface 54 faces to sufficiently fill up a gap that may be formed between the adhesive layer and the inorganic light-emitting diodes 50 upon adhering of the adhesive layer to the substrate 40.

The adhesive layer is not limited to the embodiment of the disclosure, and the adhesive layer may be provided as a separate component from the front cover 70 and positioned between the front cover 70 and the mounting surface 41 to adhere the front cover 70 to the mounting surface 41.

Accordingly, because the front cover 70 is closely adhered to the mounting surface 41 to protect components mounted on the mounting surface 41, the display module 30 may adhere the front cover 70 directly to the substrate 40 without an additional molding component formed between the front cover 70 and the substrate 40.

The front cover 70 may diffuse and reflect incident light from the outside to prevent the incident light from being specularly reflected to a user's eyes.

By diffusing and reflecting incident light from the outside, a glaring effect may deteriorate, and accordingly, contrast of a screen displayed on the display panel 20 may be improved.

Also, the front cover 70 may deteriorate transmittance of incident external light or external light reflected from the substrate 40 and the gap G.

The front cover 70 according to an embodiment of the disclosure may include a material that deteriorates transmittance of light to absorb at least a part of light transmitted toward the substrate 40 or reflected light reflected from the substrate 40 and traveling in the first direction X.

Upon manufacturing of a plurality of substrates, some substrates may have different colors due to errors in a manufacturing process. Accordingly, substrates having different unique colors may be tiled to constitute a single display panel.

As described above, the front cover 70 according to an embodiment of the disclosure may absorb at least a part of light reflected from the substrate 40 and transmitted to the outside, thereby raising a sense of unity of a screen of the display panel 20.

That is, the front cover 70 may deteriorate color deviation of the plurality of display modules 30A to 30P, generated in a process for the display modules 30A to 30P, by deteriorating transmittance with respect to external light.

The front cover 70 may improve contrast of a screen displayed on the display panel 20 by preventing external light entered the display panel 20 from the outside from being transmitted to the substrate 40, and additionally absorbing a part of light entered the display panel 20 from the outside or absorbing a part of external light reflected from the substrate 40 and transmitted to the outside of the display panel 20. Such different optical actions may be implemented through the plurality of layers described above.

That is, the front cover 70 may be positioned in front of the substrate 40 in the first direction X to improve contrast that may deteriorate by external light in a screen displayed on the display panel 20.

In the display module 30 according to an embodiment of the disclosure, the front cover 70 may extend to the outer location from the substrate 40 in the third direction Z, as described above.

Accordingly, a part of light entered the gap G formed between the plurality of display modules 30A to 30P may be blocked by at least one portion of the front cover 70 positioned above the gap G, and at least a part of external light entered the gap G or external light reflected in the gap G may be absorbed by the front cover 70 positioned above the gap G and thus prevented from being transmitted to the outside. Accordingly, recognition of a seam formed in the gap G may deteriorate, and according to the deterioration of recognition of the seam, a sense of unity of a screen displayed on the display panel 20 may be improved.

More specifically, the side 75 of the front cover 70 in the third direction Z may be positioned at an outer location than the edge 41S of the mounting surface 41 in the second direction Z, or above the gap G.

Accordingly, the front cover 70 may include a first area 71 positioned at the outer location than the edge 41S of the mounting surface 41 in the third direction Z, or above the gap G, and a second area 72 positioned on the mounting surface 41.

The first area 71 and the second area 72 of the front cover 70 may be divided by the gap G in the third direction Z.

The first area 71 of the front cover 70 may be positioned above the gap G to block external light radiated toward the gap G or prevent light reflected in the gap G from being radiated to the outside, thereby reducing recognition of a seam that is a boundary of the plurality of display modules 30A to 30P and may be formed by the gap G, which leads to an improvement of a sense of unity of the display panel 20.

The front cover 70 may extend to the outer locations than the four edges 41S of the mounting surface 41 of the substrate 40, as described above, resulting in a deterioration of recognition of seams that may be formed at the edges of the plurality of display modules 30A to 30P.

For example, in the first display module 30A and the second display module 30B, a first area 71A of the first front cover 70A of the first display module 30A, the first area 71A extending from the first display module 30A, may be positioned in a gap G formed between the first display module 30A and the second display module 30B.

Above the gap G, a side 75A of the first front cover 70A of the first display module 30A and a side 75B of a second front cover 70B of the second display module 30B neighboring the first display module 30A may be positioned.

Also, in the gap G, the side surface 45 and the chamfer portion 49 of each of the first and second display modules 30A and 30B may be positioned.

A second area 72A of the first front cover 70A of the first display module 30A may be positioned on the mounting surface 41 of the first display module 30A.

A first area 71B of the second front cover 70B of the second display module 30B, the first area 71B extending from the second display module 30B, may be positioned above the gap G formed between the first display module 30A and the second display module 30B, and a second area 72B of the second front cover 70B of the second display module 30B may be positioned on the mounting surface 41 of the second display module 30B.

That is, above the gap G formed between the first display module 30A and the second display module 30B, the first area 71A of the first front cover 70A of the first display module 30A and the first area 71B of the second front cover 70B of the second display module 30B may be aligned in the third direction Z.

A length of each of the first areas 71A and 71B of the first and second front covers 70A and 70B of the first and second display modules 30A and 30B, extending in the third direction Z, may be about half or less of a length of the gap G.

Accordingly, upon an alignment in third direction Z of the first areas 71A and 71B of the first and second front covers 70A and 70B of the first and second display modules 30A and 30B, a sum of lengths of the first areas 71A and 71B may be substantially equal to or smaller than the length of the gap G.

According to an embodiment of the disclosure, upon the alignment in third direction Z of the first areas 71A and 71B of the first and second front covers 70A and 70B of the first and second display modules 30A and 30B, a certain spacing may be formed between the side 75A of the first front cover 70A of the first display module 30A and the side 75B of the second front cover 70B of the second display module 30B. The spacing may be made by the side member 100 positioned at the side of each of the display modules 30A to 30P. The side member 100 will be described below.

As described above, the first area 71A of the first front cover 40A of the first display module 30A and the first area 71B of the second front cover 70B of the second display module 30B may be positioned above the gap G between the first display module 30A and the second display module 30B.

External light entering the display panel 20 may be transmitted through the first areas 71A and 71B of the first and second front covers 70A and 70B of the first and second display modules 30A and 30B and diffused and reflected to the outside of the display panel 20, or a part of the external light may be absorbed in the first areas 71A and 71B. Accordingly, an amount of light arrived at the gap G may be reduced, and recognition of a boundary between the first display module 30A and the second display module 30B by the gap G may be reduced.

Also, light reflected in the gap G and traveling toward the outside of the display panel 20 may be transmitted through the first areas 71A and 71B of the first and second front covers 70A and 70B of the first and second display modules 30A and 30B and diffused and reflected to the outside of the display panel 20, or a part of the light may be absorbed in the first areas 71A and 71B. Accordingly, an amount of light transmitted to the outside of the display panel 20 may be reduced, and recognition of a boundary between the first display module 30A and the second display module 30B by the gap G may be reduced.

That is, by reducing an amount of external light entering the gap G formed between the plurality of display modules 30A to 30P while absorbing at least a part of external light reflected in the gap G, a sense of unity of the display panel 20 may be improved.

Additionally, because at least a part of external light reflected from the substrates 40A and 40B to be displayed to the outside is absorbed in the first and second front covers 70A and 70B of the first and second display modules 30A and 30B such that unique colors of the substrates 40A and 40B are not recognized from the outside although the substrate 40A of the first display module 30A and the substrate 40B of the second display module 30B have different colors, a sense of unity of the display panel 20 may be improved.

The first display module 30A may include the side cover 90 positioned below the front cover 70 in the direction in which the mounting surface 41 faces and formed on the side surface 45 of the substrate 40.

More specifically, the side cover 90 may be positioned in a space defined by a lower surface 76 of the first area 71 of the front cover 70 in the first direction X, a lower surface of the anisotropic conductive layer 47, and a side surface of the substrate 40 in the third direction Z.

Also, a side 47S of the anisotropic conductive layer 47 of the display module 30 may be aligned with the side 75 of the front cover 70 in the first direction X. In this case, the side cover 90 may be positioned in a space defined by the lower surface of the anisotropic conductive layer 47 in the first direction X and the side surface of the substrate 40 in the third direction Z.

Also, the side 47S of the anisotropic conductive layer 47 of the display module 30 may be aligned with the edge 41S of the mounting surface 41 in the first direction X. In this case, the side cover 90 may be positioned in a space defined by the lower surface 76 of the first area 71 of the front cover 70 in the first direction X and the side surface of the substrate 40 in the third direction Z.

The side cover 90 may be adhered to the lower surface 76 of the first area 71, the side surface 45, and at least one portion of the metal plate 60. The side cover 90 may be adhered to the entire lower surface 76 of the first area 71. Also, the side cover 90 may cover the entire area of the side surface 45.

The lower surface 76 of the first area 71 may be at least one area of an entire lower surface of the front cover 70, and may be a rear surface of the adhesive layer formed at the lowermost location of the front cover 70.

Also, the side cover 90 may cover a pair of chamfer portions 49 positioned in a front-rear direction of the side surface 45 in the first direction X.

The side cover 90 may surround the entire of the chamfer portion 49 formed between the mounting surface 41 and the side surface 45, as well as the side surface 45.

Because the side cover 90 surrounds the chamfer portion 49 formed between the mounting surface 41 and the side surface 45, the side cover 90 may fill up a space that may be formed between the substrate 40 and the front cover 70.

Accordingly, the side cover 90 may prevent a foreign material or water from entering the space between the substrate 40 and the front cover 70 from the outside.

Also, because the side cover 90 surrounds the chamfer portion 49 formed between the rear surface 43 and the side surface 45, the side cover 90 may fill up a space that may be formed between the substrate 40 and the metal plate 60.

Accordingly, the side cover 90 may prevent a foreign material or water from entering the space between the substrate 40 and the metal plate 60 from the outside.

The side cover 90 may be in contact with the lower surface 76 of the first area 71, the chamfer portion 49 of the substrate 40, and the side surface 45. Accordingly, the side cover 90 may support the lower surface 76 of the first area 71, the chamfer portion 49 of the substrate 40, and the side surface 45.

The front cover 70 may be adhered to the substrate 40 by the front cover 70, as described above, and the side cover 90 may reinforce adhesiveness between the front cover 70 and the substrate 40. Accordingly, the side cover 90 may prevent the front cover 70 from separating from the substrate 40.

That is, reliability of the first display module 30A may be raised by the side cover 90.

Also, the metal plate 60 may be adhered to the substrate 40 by the rear adhesive tape 61, and the side cover 90 may reinforce adhesiveness between the metal plate 60 and the substrate 40. Accordingly, the side cover 90 may prevent the metal plate 60 from separating from the substrate 40.

The side surface 45 of the substrate 40 may correspond to the four edges 41S of the mounting surface 41, and the first area 71 of the front cover 70 may extend to the outer locations than the four edges 41S of the mounting surface 41 in the second direction Y and the third direction Z in which the mounting surface 41 extends.

The side cover 90 may surround the lower surface 76 of the first area 71 and the side surface 46 corresponding to each of the four edges 41S of the mounting surface 41 along a circumference of the four edges 41S of the mounting surface 41.

That is, the side cover 90 may seal the entire edges of portions at which the substrate 40 is adhered to the front cover 70.

The side cover 90 may cover the lower surface 76 of the first area 71 and the side surface 45 in all directions that are orthogonal to the first direction X.

Accordingly, coupling between the front cover 70 and the substrate 40 may be improved, and the front cover 70 and the side surface 45 of the substrate 40 may be protected from an external force.

Also, the side cover 90 may prevent external water or a foreign material from entering between the substrate 40 and the front cover 70, as described above. In addition, the side cover 90 may prevent external water or a foreign material from entering a gap formed between the substrate 40 and the front cover 70 due to low adhesiveness.

The side cover 90 may surround the four edges E of the substrate 40 along the side surface 45 of the substrate 40 to seal between the substrate 40, the front cover 70, and the metal plate 60.

Accordingly, the side cover 90 may prevent a foreign material or water entered in all directions from entering the substrate 40 and the front cover 70.

As described above, because the lowermost end of the front cover 70 in the first direction X is provided as an adhesive layer, the lower surface 76 of the first area 71 may be provided as a rear surface of the adhesive layer.

Accordingly, upon exposure of the lower surface 76 of the first area 71 to the outside, a foreign material existing in the outside may be adhered to the lower surface 76 of the first area 71.

Upon an arrangement of the plurality of display modules 30A to 30P in a state in which a foreign material is adhered to the lower surface 76 of the first area 71, recognition of a seam generated between the plurality of display modules 30A to 30P may increase due to the foreign material adhered to the lower surface 76 of the first area 71.

However, because the display module 30A according to an embodiment of the disclosure includes the side cover 90 and the side cover 90 covers the lower surface 76 of the first area 71, it may be possible to prevent a foreign material from being adhered to the lower surface 76 of the first area 71.

Accordingly, it may be possible to reduce visibility of a seam generated between the plurality of display modules 30A to 30P, caused by a foreign material adhered to the front cover 70 upon an arrangement of the plurality of display modules 30A to 30P.

Also, current may enter a plurality of electronic components mounted on the substrate 40 by an electrostatic discharge that may occur on the display modules 30A to 30P to damage the electronic components, which will be described below. The side cover 90 may prevent charges generated by an electrostatic discharge from entering the substrate 40 by sealing the substrate 40 from the outside to prevent the electronic components from being damaged.

That is, because the substrate 40 is sealed by the front cover 70 and the side cover 90 to prevent charges generated by an electrostatic discharge from passing through the front cover 70 and the side cover 90, the charges may be prevented from flowing to the substrate 40 and charges flowing on the front cover 70 and the side cover 90 may be guided to the metal plate 60 being in contact with the side cover 90, thereby providing a path of current by an electrostatic discharge. Accordingly, ESD pressure resistance of the electronic components mounted on the substrate 40 may be improved.

The first display module 30A may be positioned below the front cover 70 in the direction in which the mounting surface 41 faces, as described above. That is, the side cover 90 may be not positioned above the lower surface 76 in the first direction X.

A foremost surface of the side cover 90 in the first direction X may be in contact with the lower surface 76 of the first area 71, and may be not positioned in front of the lower surface 76 of the first area 71 in the first direction X.

The reason may be not to position the side cover 90 on a traveling path of light radiated from the plurality of inorganic light-emitting diodes 50.

In a case in which at least one portion of the side cover 90 is positioned in front of the lower surface 76 or in front of the front cover 70 in the first direction X, the side cover 90 may be positioned on a path of light traveling in the front direction through the front cover 70.

That is, the side cover 90 may absorb or diffuse and reflect a part of traveling light to distort some area of an image displayed in the display module 20.

However, because the side cover 90 according to an embodiment of the disclosure is positioned behind the front cover 70 in the first direction X, the side cover 90 may not limit a movement of light radiated by the plurality of inorganic light-emitting diodes 50, thereby improving image quality of the display panel 20.

The side 75 of the front cover 70 in the third direction Z and the side 91 of the side cover 90 in the third direction Z may be substantially aligned in the first direction X.

The reason may be because the front cover 70 and the side cover 90 are cut simultaneously in a process of manufacturing the display module 30A. Also, the side member 100 may be adhered to the side 75 of the front cover 70 and the side 91 of the side cover 90 substantially aligned in the first direction X.

That is, a spacing that is formed between the plurality of display modules 30A to 30P upon an arrangement of the plurality of display modules 30A to 30P may be reduced, and a seam that may be recognized by the spacing between the plurality of display modules 30A to 30P may be reduced.

The side cover 90 may include a material that absorbs light. For example, the side cover 90 may be formed of an opaque or translucent material.

Also, the side cover 90 may include a photosensitive material. For example, the side cover 90 may be formed of a photosensitive OCR. According to irradiating of external light such as ultraviolet light (UV) having another wavelength except for a visible light wavelength to the photosensitive material, the photosensitive material may change a physical property to show a dark color.

Accordingly, the side cover 90 may be formed of a material that is colored with a dark color upon irradiating the side cover 90 with ultraviolet light (UV) to during a manufacturing process to absorb light.

The side cover 90 may have a dark color. The side cover 90 may have a color that is darker than the front cover 70.

The side cover 90 may have a color that is similar to that of the black matrix 48.

Accordingly, light that enters the side cover 90 may be absorbed in the side cover 90 without being reflected, by the material absorbing light.

The side cover 90 may be positioned in the gap G formed between the plurality of display modules 30A to 30P together with the first area 71 of the front cover 70 upon an arrangement of the plurality of display modules 30A to 30P.

Accordingly, the side cover 90 may absorb light that enters the gap G to reduce light that enters the gap G, is reflected, and then emitted to the outside. Accordingly, recognition of a seam that is formed by the gap G formed between the plurality of display modules 30A to 30P may deteriorate.

For example, in the first display module 30A and the second display module 30B, a side cover 90A of the first display module 30A and a side cover 90B of the second display module 30B may be positioned in the gap G formed between the first display module 30A and the second display module 30B together with the first area 71A of the first front cover 70A of the first display module 30A and the first area 71B of the second front cover 70B of the second display module 30B.

In the gap G, a side 91S of the side cover 90A of the first display module 30A and a side 91B of the side cover 90B of the second display module 30B may be positioned together with the neighboring sides 75A and 75B of the first and second front covers 70A and 70B of the first and second display modules 30A and 30B.

The neighboring sides 75A and 75B of the first and second front covers 70A and 70B of the first and second display modules 30A and 30B and the neighboring sides 91A and 91B of the side covers 90A and 90B of the first and second display modules 30A and 30B may face each other. The neighboring sides 75A and 75B of the first and second front covers 70A and 70B of the first and second display modules 30A and 30B and the neighboring sides 91A and 91B of the side covers 90A and 90B of the first and second display modules 30A and 30B may be positioned in parallel to each other.

That is, in the gap G formed between the first display module 30A and the second display module 30B, the first areas 71A and 71B of the front covers 70A and 70B of the first and second display modules 30A and 30B and the side covers 90A and 90B of the first and second display modules 30A and 30B may be aligned in the third direction Z.

A length of each of the side covers 90A and 90B of the first and second display modules 30A and 30B, extending in the third direction Z, may be about half or less of the gap G to correspond to the first areas 71A and 71B of the front covers 70A and 70B of the first and second display modules 30A and 30B.

In the gap G between the first display module 30A and the second display module 30B, the first area 71A of the first front cover 70A of the first display module 30A and the first area 71B of the second front cover 70B of the second display module 30B may be positioned, and the side covers 90A and 90B of the first and second display modules 30A and 30B may be positioned behind the first areas 71A and 71B in the first direction X.

As described above, external light entered the display panel 20 may be transmitted through the first and second areas 71A and 71B of the first and second front covers 70A and 70B of the first and second display modules 30A and 30B and then diffused and reflected to the outside of the display panel 20, or a part of the external light may be absorbed in the first areas 71A and 71B. As a result, an amount of light arrived at the gap G may be reduced.

In addition, light arrived at the gap G may be absorbed in the side covers 90A and 90B of the first and second display modules 30A and 30B, positioned in the gap G, and accordingly, recognition of a boundary between the first display module 30A and the second display module 30B may be reduced.

That is, by reducing an amount of external light entering the gap G formed between the plurality of display modules 30A to 30P while additionally absorbing light arrived at the gap G, a sense of unity of a screen of the display panel 20 may be improved.

In addition, light reflected from the side covers 90A and 90B of the first and second display modules 30A and 30B and traveling to the outside of the display panel 20 without being absorbed in the side covers 90A and 90B may be transmitted through the first areas 71A and 71B of the first and second front covers 70A and 70B to be diffused and reflected to the outside of the display panel 20, or a part of the light may be absorbed in the first areas 71A and 71B. Accordingly, an amount of light transmitted to the outside of the display panel 20 may be reduced, resulting in a reduction of recognition of a boundary between the first display module 30A and the second display module 30B by the gap G.

Because the side cover 90 is arranged in the gap G formed between the plurality of display modules 30A to 30P upon an arrangement of the plurality of display modules 30A to 30P, as described above, the side cover 90 may absorb light arrived at the gap G to reduce visibility of a seam that may be recognized by the gap G.

According to the above-described example, the front cover 70 may reduce an amount of light arriving at the substrate 40 by diffusing and reflecting, absorbing, or circularly polarizing a part of light that enters the display module 20 or changing a reflection direction of the light, although embodiments are not limited thereto.

However, the front cover 70 may be formed of a transparent material that transmits light without distorting the light. In this case, the side cover 90 positioned between the plurality of display modules 30A to 30P may also reduce recognition of a boundary between the plurality of display modules 30A to 30P by the gap G.

Because the side cover 90 is formed of a material absorbing light, as described above, a part of light radiated from the plurality of inorganic light-emitting diodes 50 may be absorbed in the side cover 90 in a case in which at least one portion of the side cover 90 is positioned in front of the front cover 70 in the first direction X. Accordingly, an area of a screen displayed on the display module 20 may be shown to be dark.

However, because the side cover 90 according to an embodiment of the disclosure is positioned below the front cover 70 in the first direction X, more specifically, below the lower surface 76 of the first area 71, the side cover 90 may not absorb light radiated from the plurality of inorganic light-emitting diodes 50, and accordingly, brightness of an image displayed on the display module 20 may become uniform.

The anisotropic conductive layer 47 may be an anisotropic conductive film. The anisotropic conductive layer 47 may be bonded with the TFT layer 44 in a film type on the TFT layer 44.

The anisotropic conductive layer 47 may be formed in a film type, and an area of the anisotropic conductive layer 47 may be larger than an area of the substrate 40.

Accordingly, after the anisotropic conductive layer 47 is bonded with the TFT layer 44, a process of cutting the anisotropic conductive layer 47 such that the area of the anisotropic conductive layer 47 corresponds to the area of the substrate 40 may be performed.

The cutting process may be to cut the anisotropic conductive layer 47 to correspond the area of the anisotropic conductive layer 47 to the area of the substrate 40 through laser cutting, etc.

The anisotropic conductive layer 47 may have an area corresponding to an area of the mounting surface 41. However, because the anisotropic conductive layer 47 is formed as an anisotropic conductive film, as described above, it may be not easy to correspond the area of the anisotropic conductive film to the area of the mounting surface 41. Also, upon adhering of the anisotropic conductive film corresponding to the area of the mounting surface 41 to the mounting surface 41, the anisotropic conductive film may have a smaller section than the mounting surface 41 due to manufacturing tolerance, resulting in deterioration of reliability of the display module 30.

Accordingly, by adhering an anisotropic conductive film having a larger area than the mounting surface 41 to the substrate 40 and then cutting the anisotropic conductive film to an area corresponding to the area of the substrate 40, the anisotropic conductive layer 47 may be formed.

The side surface 45 of the substrate 40 may be positioned at an outer location than the mounting surface 41 by the chamfer portion 49. The anisotropic conductive film may be cut based on a side of the coating member 46a forming a side of the side wire 46 in the third direction Z.

The reason may be because there is a risk that the side surface 45, the chamfer portion 49, or the side wire 46 of the substrate 40 will be damaged upon cutting of the anisotropic conductive film based on the mounting surface 41.

However, the anisotropic conductive film may be cut together with the front cover 70 to form the anisotropic conductive layer 47. In this case, the side 47S of the anisotropic conductive layer 47 may be aligned with the side 75 of the front cover 70 in the first direction X.

In this case, the side 47S of the anisotropic conductive layer 47 may be exposed to the outside and damaged by static electricity. However, ESD reliability may be secured by the side member 100 which will be described below.

Accordingly, upon cutting of the anisotropic conductive film, the side 47S of the anisotropic conductive layer 47 may be positioned at an outer location than the mounting surface 41. More specifically, because the anisotropic conductive film is cut based on the side surface 45 or the side 46S of the side wire 46, as described above, the side 47S of the anisotropic conductive layer 47 may be aligned with the side surface 45 or the side 46S of the side wire 46 in the first direction X. Also, the side 47S of the anisotropic conductive layer 47 may be positioned at the outer location than the side surface 45 or the side 46S of the side wire 46 by manufacturing tolerance or burr formed in the anisotropic conductive film upon cutting.

However, to prevent the substrate 40 from being damaged in an actual cutting process, a cutting location of the anisotropic conductive film may be an outer location than the side surface 45 or the side 46S of the side wire 46.

Accordingly, the side 47S of the anisotropic conductive layer 47 may be formed outside the substrate 40. Particularly, the side 47S of the anisotropic conductive layer 47 may be positioned at an outer location than the side cover 90.

The side cover 90 may cover an outer side of the side surface 45 in the second direction Y, as well as an outer side of the side surface 45 of the substrate 40 in the third direction Z, as shown in FIG. 7.

That is, the side cover 90 may surround all the four edges E of the substrate 40, as described above.

Accordingly, the mounting surface 41 which is the front surface of the substrate 40 may be covered by the front cover 70, the rear surface 43 of the substrate 40 may be covered by the metal plate 60, and the side surface 45 and the chamfer portion 49 of the substrate 40 may be covered by the side cover 90.

The front cover 70 may be formed of a non-conductive material through which no charges are transmitted.

The side cover 90 may be formed of a non-conductive material through which no charges are transmitted.

Because the front cover 70 and the side cover 90 are formed of a non-conductive material, a major part of current applied to the front cover 70 or the side cover 90 may flow on the front cover 70 and the side cover 90 without being transmitted through the front cover 70 and the side cover 90.

The metal plate 60 may be formed of a material having great capacitance, and function as a ground. Accordingly, upon applying of current to the metal plate 60, the metal plate 60 may be maintained at a constant potential. The current applied to the metal plate 60 may be absorbed in the metal plate 60, and no current may flow to the substrate 40 through the metal plate 60.

Also, the entire side wire 46 of the substrate 40 may be surrounded by the side cover 90, and accordingly, the side wire 46 may be sealed not to be exposed to the outside. Accordingly, static electricity discharged from the side surface 45 of the substrate 40 may not enter the side wire 46 due to the side cover 90.

In a display apparatus manufacturing process of implementing a display panel with display modules, the display panel may be formed by tiling a plurality of display modules. During a process for forming the display panel with the display modules, current generated by an electrostatic discharge may enter the inside of the display modules while the display modules are manufactured and conveyed, which may damage electronic components mounted inside the display modules.

Particularly, due to a failure generated during a process of manufacturing a display module, a side wire extending along a side surface of a substrate may be exposed to the outside or a spacing may be made between an anisotropic conductive layer and a front cover or the substrate, and during a process of applying a side cover and hardening the side cover, a spacing may be made inside the side cover. In this case, due to a process failure caused by an electrostatic discharge, current may enter electronic components such as the side wire mounted on the substrate to damage the electronic components.

Each of the display modules 30A to 30P may include a component configured to prevent current generated by an electrostatic discharge from entering components mounted on the substrate 40, and accordingly, current generated by an electrostatic discharge may be easily guided to the metal plate 60 which is a ground component along the front cover 70 and the side cover 90 sealing the substrate 40 on each of the display modules 30A to 30P, without entering the components mounted on the substrate 40.

The display apparatus 1 according to an embodiment of the disclosure may further include the side member 100 positioned on an outer side of the side cover 90 of the display module 30 in the third direction Z and formed of a material having higher conductivity than the side cover 90 to prevent current from flowing to, particularly, the side wire 46 according to an electrostatic discharge.

Because the side wire 46 is positioned on the side surface 45 corresponding to each of the upper edge 32 and the lower edge 34 positioned in the third direction Z, as described above, the side member 100 may be positioned on an outer side of the side cover 90 formed in the third direction Z in which the side wire 46 is positioned.

The side member 100 may easily guide static electricity to the metal plate 60 although the display modules 30A to 30P are not completely sealed due to a manufacturing failure.

The side member 100 may cover the outer side of the side surface 45 of the substrate 40 in the third direction, as shown in FIG. 7. That is, the side member 100 may be positioned on a pair of edges 32 and 34 among the four edges E of the substrate 40. More specifically, the side member 100 may be formed on one side surface 45 among side surfaces 45 corresponding to the pair of edges 32 and 34 on which the side wire 46 is positioned to reduce a width of a gap G formed between the display modules 30A to 30P upon an arrangement of the display modules 30A to 30P. This will be described in detail below.

In regard of the first display module 30A, the side member 100 may be positioned on the side surface 45 corresponding to the lower edge 34 of the first display module 30A. Also, no side member 100 may be positioned on the side surface 45 corresponding to the upper edge 32 of the display module 30A.

In regard of the second display module 30B, the side member 100 may be positioned only on the side surface 45 corresponding to the lower edge of the second display module 30B, like the first display module 30A, and in regard of the fourth display module 30C and the sixth display module 30D, the side member 100 may also be positioned only on the side surface 45 corresponding to the lower edge of each of the fourth display module 30C and the sixth display module 30D.

The side member 100 may be formed of a metal material having higher conductivity than the side cover 90. The side member 100 may be coated on the side cover 90 to be positioned on the side 91 of the side cover 90.

Accordingly, the side member 100 may be positioned in the gap G formed between the display modules 30A to 30P upon an arrangement of the display modules 30A to 30P.

One end of the side member 100 may be in contact with the metal plate 60, and the other end of the side member 100 may be positioned on the side 91 of the side cover 90. That is, the side member 100 may cover at least one portion of the metal plate 60, and at least one portion of the side cover 90 in the third direction Z.

The side member 100 may be a thin film. The reason may be because the side member 100 is positioned in the gap G formed between the display modules 30A to 30A upon tiling of the display modules 30A to 30P. In a case in which the side member 100 is thick, the gap G formed between the display modules 30A to 30P may become wide due to the thickness of the side member 100, which may cause recognition of a seam between the display modules 30A to 30P.

However, although the side member 100 is a thin film, a certain spacing between neighboring ones of the display modules 30A to 30P may be made by the side member 100. To reduce the certain spacing between the neighboring display modules 30A to 30P, a single side member 100 may be positioned between the sides 91 of the side covers 90 of the neighboring display modules 30A to 30P, which will be described in detail below.

The side member 100 may be formed of a material having high conductivity. For example, the side member 100 may be formed of a metal, a conductive polymer, a conductive fabric, or the like, to be electrically grounded to the metal plate 60.

The side member 100 may be formed of a material having higher conductivity than the side cover 90. Also, the side member 100 may be formed of a material having higher conductivity than the front cover 70.

Accordingly, current generated on the front cover 70 or the side cover 90 by an electrostatic discharge may not enter the substrate 40 because the current is not transmitted through the front cover 70 or the side cover 90, and the current may enter the side member 100 while flowing on the front cover 70.

The current flowed to the side member 100 may flow to the metal plate 60 through the side member 100, because the side member 100 is in contact with the metal plate 60 to be grounded to the ground component.

That is, the side member 100 may provide a path of current, along which current generated on the front cover 70 or the side cover 90 by an electrostatic discharge flows to the metal plate 60 provided as a ground component. The side member 100 may guide charges generated by an electrostatic discharge to flow to the ground.

Accordingly, because a major part of current generated on the front cover 70 or the side cover 90 by an electrostatic discharge flows to the metal plate 60 through the side member 100 having high conductivity, ESD pressure resistance of the electronic components mounted on the substrate 40 may be improved although some current flows to the substrate 40.

Additionally, electrostatic current transferred to the metal plate 60 may be discharged to an external ground through components, such as a bridge board, a cable, etc., which are in contact with the metal plate 60.

The side member 100 may have a dark color. The side member 100 may have a black color. The side member 100 may have a color that is darker than that of the front cover 70.

The side member 100 may have a color that is similar to that of the black matrix 48 or the side cover 90. Accordingly, light entered the side member 100 may be absorbed in the side member 100 without being reflected.

As described above, each of the display modules 30A to 30P may include the front cover 70, the side cover 90, the metal plate 60, and the side member 100, independently, to prevent penetration of current according to an electrostatic discharge.

As described above, the side member 100 may be positioned on only one side surface 45 of the pair of side surfaces 45 along which the side wire 46 extends.

For example, in the first display module 30A and the second display module 30B, a side member 100A may be positioned on the side surface 45 of the first display module 30A, neighboring the second display module 30B in the third direction Z.

No side member may be positioned on the side surface 45 of the second display module 30B, neighboring the first display module 30A in the third direction Z. Accordingly, the side member 100A of the first display module 30A may face the side 91B of the side cover 90 of the second display module 30B in such a way as to be in contact with the side 91B.

Accordingly, a spacing T between the sides 91A and 91B of the first display module 30A and the second display module 30B may have a length corresponding to a thickness t of the side member 100.

In a case in which two side members 100 are positioned respectively on the pair of side surfaces 45 on which the side wire 46 is formed in the first and second display modules 30A and 30B, a spacing T between the sides 91A and 91B of the first and second display modules 30A and 30B may have a length corresponding to a total thickness 2t of the two side members 100. As a result, the spacing T may have a longer length to further increase the gap G between the first and second display modules 30A and 30B, which raises recognition of a seam.

However, according to an embodiment of the disclosure, only one side member 100A may be positioned between the side 91A of the first display module 30A and the side 91B of the second display module 30B, as described above. Accordingly, the spacing T between the sides 91A and 91B of the first display module 30A and the second display module 30B may be reduced, resulting in a reduction of visibility of a seam between the display modules 30A and 30B.

However, the side member 100 may be positioned on the side surface 45 corresponding to the upper edge 32, instead of the side surface 45 corresponding to the lower edge 34. In this case, the side member 100 may be positioned on the side surface 45 corresponding to the upper edge 32 of the second display module 30B between the first display module 30A and the second display module 30B, and no side member 100 may be positioned on the first display module 30 between the first display module 30A and the second display module 30B.

As such, although only one side member 100 of the first display module 30A is positioned between the first display module 30A and the second display module 30B, current that is generated by an electrostatic discharge between the first display module 30A and the second display module 30B and enters the side cover 90B of the second display module 30B may be guided through the side member 100 of the first display module 30A, being in contact with the side 91B of the side cover 90B of the second display module 30B, resulting in high reliability against ESD of the second display module 30B.

That is, although the side member 100A is positioned on the first display module 30A between the first and second display modules 30A and 30B being adjacent to each other in the third direction Z among the display modules 30A to 30P, both the first and second display modules 30A and 30B may be in contact with the side member 100A, and accordingly, reliability against ESD of the first and second display modules 30A and 30B may be raised through the side member 100A in spite of current that is generated by an electrostatic discharge between the first and second display modules 30A and 30B.

As described above, the first display module 30A may be positioned at the uppermost location of the display panel 20, and the side member 100A may be positioned only on the side surface 45 corresponding to the lower edge 34 in the third direction Z. Accordingly, no side member 100 may be not positioned on the upper edge 32.

Also, in the second display module 30B, the fourth display module 30C, and the sixth display module 30D, the side member 100 may be not positioned on the side surfaces 45 corresponding to the upper edges 32 of the second display module 30B, the fourth display module 30C, and the sixth display module 30D, and side members 100B, 100C, and 100D may be positioned respectively on the side surfaces 45 corresponding to the lower edges 34 of the second display module 30B, the fourth display module 30C, and the sixth display module 30D.

In this case, although the side members 100B, 100C, and 100D of the second, fourth, and sixth display modules 30B, 30C, and 30D are not positioned on the side surfaces 45 corresponding to the respective upper edges 32, the side members 100A, 100B, and 100C of the first, second, and fourth display modules 30A, 30B, and 30C being adjacent to the second, fourth, and sixth display modules 30B, 30C, and 30D in the third direction Z may be positioned on the side surfaces 45 corresponding to the upper edges 32 of the second, fourth, and sixth display modules 30B, 30C, and 30D. Accordingly, reliability against ESD may be improved by the side members 100A, 100B, and 100C of the adjacent first, second, and fourth display modules 30A, 30B, and 30C although none of the side members 100B, 100C, and 100D is positioned on the side surfaces 45 corresponding to the upper edges 32 of the second, fourth, and sixth display modules 30B, 30C, and 30D.

However, because there is no display module being adjacent to the side surface 45 corresponding to the upper edge 32 of the first display module 30A in the third direction Z, current may enter the side surface 45 upon occurrence of an electrostatic discharge on the side surface 45 corresponding to the upper edge 32 of the first display module 30A to damage the side wire 46 and the electronic components of the first display module 30A.

To prevent such damage, the display apparatus 1 according to an embodiment of the disclosure may include a frame side member 200 positioned on the frame 15, being in contact with the side surface 45 corresponding to the upper edge 32 of the first display module 30A supported on the frame 15, and grounded to the frame 15.

The frame 15 may be formed of a metal material and function as a ground component on a circuit.

The frame side member 200 may be formed of a material having higher conductivity than the side cover 90. For example, the frame side member 200 may be formed of a metal, a conductive polymer, a conductive fabric, or the like, to be electrically grounded to the metal plate 60.

The frame side member 200 may be formed at an area being adjacent to the upper edge of the frame 15 in the third direction Z. The frame side member 200 may extend in the second direction Y to cover all of the side surfaces 45 corresponding to the upper edges 32 of the third display module 30E, the fifth display module 30I, and the seventh display module 30M aligned with the first display module 30A in the second direction Y, as well as the first display module 30A.

That is, to protect the side surfaces 45 corresponding to the upper edges 32 of the third display module 30E, the fifth display module 30I, and the seventh display module 30M, wherein no side member 100 is positioned on the side covers 90 formed on the side surfaces 45 corresponding to the upper edges 32, as well as the first display module 30A, the frame side member 200 may cover at least one portions of the side covers 90 of the first, third, fifth, and seventh display modules 30A, 30E, 30I, and 30M.

Accordingly, upon applying of current caused by an electrostatic discharge onto the side surfaces 45 corresponding to the upper edges 32 of the first, third, fifth, and seventh display modules 30A, 30E, 30I, and 30M, the current may flow to the frame 15 through the frame side member 200.

Accordingly, although the side member 100 is positioned only on any one side 45 of the pair of side surfaces 45 on which the side wire 46 extends in each of the display modules 30A to 30P, as described above, ESD reliability of the other side surface 45 on which no side member 100 is positioned may be improved by the side member 100 of another display module being adjacent to the corresponding display module in the third direction Z or the frame side member 200.

Also, because the side member 100 is positioned only on any one side 45 of the pair of side surfaces 45 on which the side wire 46 extends in each of the display modules 30A to 30P, a length of a gap between display modules being adjacent to each other in the third direction Z may be reduced, resulting in a reduction of recognition of seams between the display modules 30A to 30P.

However, in a case in which the side member 100 is positioned on the side surface 45 corresponding to the lower edge 34 of each of the display modules 30A to 30P in the third direction Z, instead of the upper edge 32, the frame side member 200 may extend along the second direction at an area of the frame 15, being adjacent to the lower edge 34.

In this case, the frame side member 200 may cover the side cover 90 formed on the side surface 45 corresponding to the lower edge 34 of the sixth display module 30D, and the side covers 90 formed on the side surfaces 45 corresponding to the lower edges 34 of the display modules 30H, 30L, and 30P aligned with the sixth display module 30D in the second direction Y.

Additionally, the side member 100 may be positioned only on any one side surface of a pair of side surfaces 45 on which no side wire 46 extends, that is, side surfaces 45 corresponding to the left edge 33 or the right edge 31 being opposite to each other in the second direction Y.

The reason may be to prevent current from entering the side cover 90 formed on the side surface 45 corresponding to the left edge 33 or the right edge 31 to damage electronic components of the corresponding display module, although no side wire 46 is positioned on the side surface 45.

In this case, the side member 100 may be positioned on any one side surface 45 of the pair of side surfaces in the second direction Y On the side surface 45 on which the side portion 100 is not positioned in the second direction Y in each of the display modules 30A to 30P, a side member 100 of another display module being adjacent to the corresponding display module in the second direction Y may be positioned to raise ESD reliability.

The side member 100 positioned in the second direction Z and the side member 100 positioned in the second direction Y may be integrated into one body, and accordingly, the side member 100 may have a shape surrounding two neighboring side surfaces 45 among four side surfaces 45 of each of the display modules 30A to 30P. For example, the side member 100 may surround the side covers 90 formed on the side surfaces 45 corresponding to the right edge 31 and the lower edge 34.

Also, in a case in which the side member 100 is additionally positioned on the side surface 45 corresponding to the right edge 31 of each of the display modules 30A to 30P in the second direction Y, the display apparatus 1 may further include the frame side member 200 extending in the third direction Z at an area being adjacent to the left edge of the frame 15.

Hereinafter, the display modules 30A to 30P according to another embodiment of the disclosure will be described. The remaining components except for a side wire 46 formed in the second direction Y, which will be described below, are the same as the corresponding ones of the display apparatus 1 according to an embodiment of the disclosure as described above, and therefore, overlapping descriptions thereof will be omitted. Particularly, an arrangement in third direction Z of the display modules 30A to 30P according to another embodiment of the disclosure is the same as that of the display apparatus 1 shown in FIGS. 6 and 7, and therefore, an arrangement in second direction Y of the display modules 30A to 30P will be described.

Figure 9:
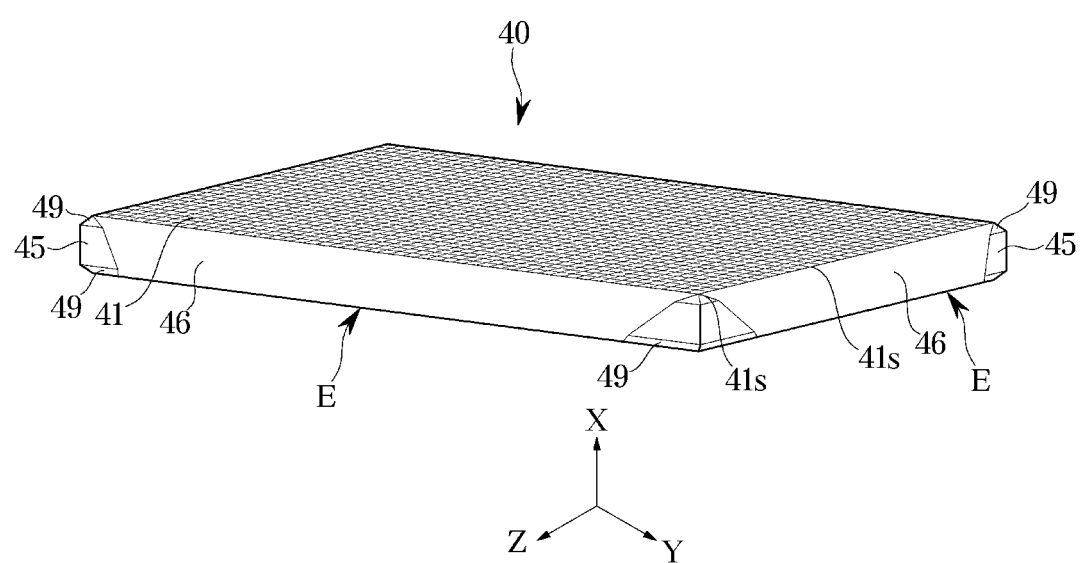
FIG. 9 is a perspective view showing some components of a display module according to another embodiment of the disclosure.
Figure 10:
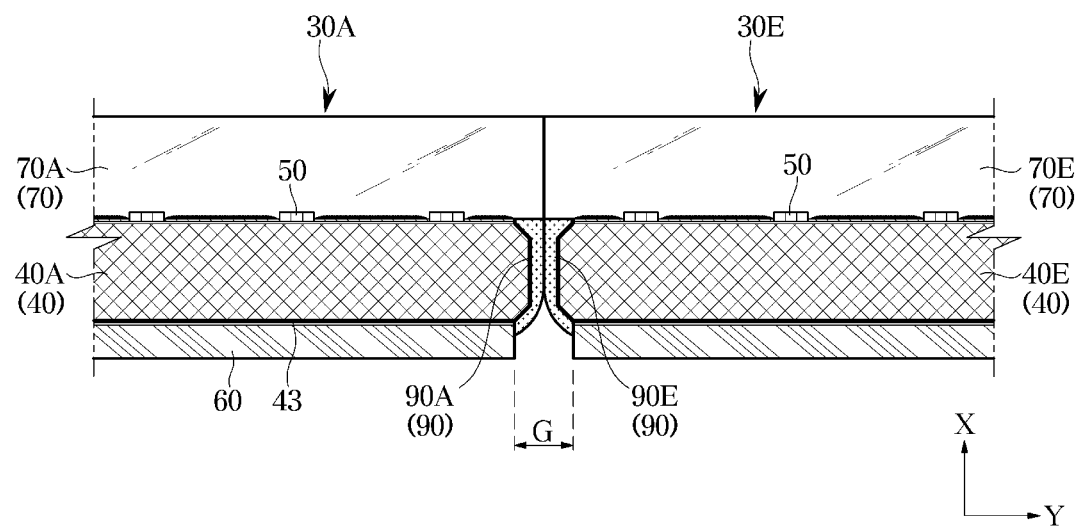
FIG. 10 is a cross-sectional view showing some components of a display apparatus according to another embodiment of the disclosure in a second direction.
Figure 11:
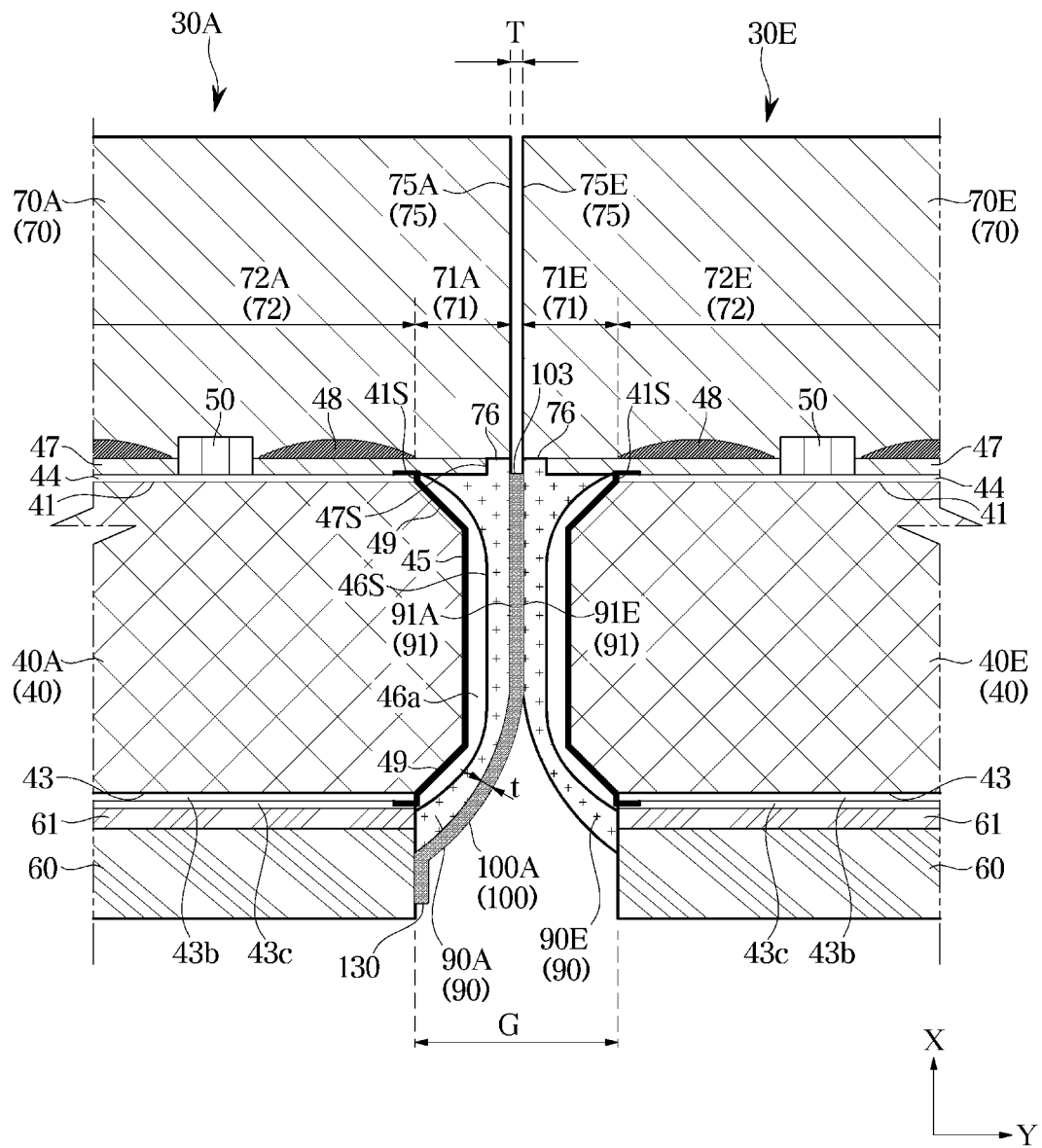
FIG. 11 is an enlarged cross-sectional view of the some components shown in FIG. 10.
Figure 12:
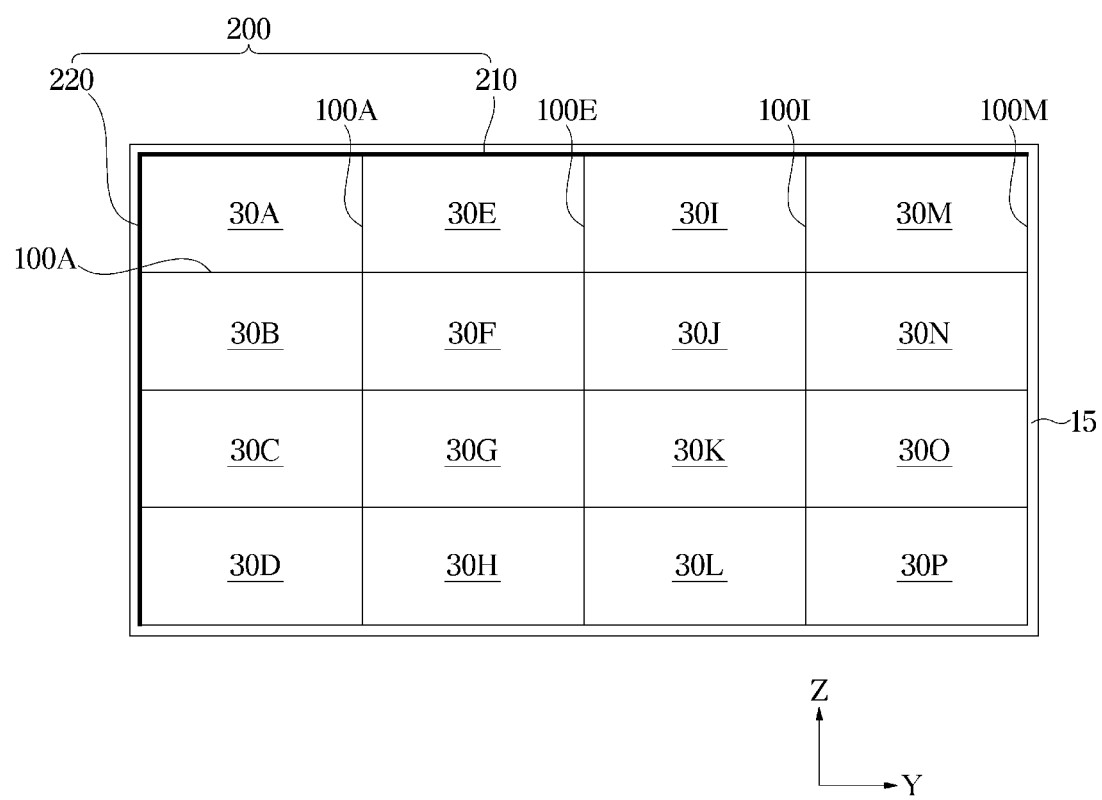
FIG. 12 schematically shows a front side of some components of a display apparatus according to another embodiment of the disclosure.

FIG. 9 is a perspective view showing some components of a display module according to another embodiment of the disclosure, FIG. 10 is a cross-sectional view showing some components of a display apparatus according to another embodiment of the disclosure in a second direction, FIG. 11 is a cross-sectional view of the some components shown in FIG. 10, and FIG. 12 schematically shows a front side of some components of a display apparatus according to another embodiment of the disclosure.

FIG. 9 shows a substrate 40 from which a component such as an anisotropic conductive layer 47 is excluded, for convenience of description. Also, a side wire 46 may include a coating member 46a (see FIG. 7) for protecting the side wire 46 from outside, and for convenience of description.

As shown in FIG. 9, the side wire 46 may be positioned on all four side surfaces 45 corresponding to four edges 31, 32, 33, and 34 of a display module 30.

That is, according to the above-described embodiment of the disclosure, the side wire 46 may be positioned only on a pair of side surfaces 45 of the display module 30. However, according to another embodiment of the disclosure, the side wire 46 may be formed on all the four side surfaces 45.

Accordingly, a side member 100 may be formed on one side surface 45 of a pair of side surfaces 45 being opposite to each other in the third direction Z and one side surface 45 of a pair of side surfaces 45 being opposite to each other in the second direction Y.

The side member 100 may cover an outer side of a side surface 45 of a substrate 40 in the second direction Z, as shown in FIGS. 10 and 11. More specifically, side members 100 may be positioned respectively on a side surface 45 corresponding to one edge 34 of two edges 32 and 34 positioned in the third direction Z among four edges E of the substrate 40 and a side surface 45 corresponding to one edge 31 of two edges 31 and 32 positioned in the second direction Y.

The reason may be to reduce widths of gaps G formed between display modules 30A to 30P upon an arrangement of the display modules 30A to 30P.

In regard of a first display module 30A, the side member 100 may be positioned on a side surface 45 corresponding to a right edge 31 of the first display module 30A. Also, the side member 100 may be not positioned on a side surface 45 corresponding to a left edge 33 of the display module 30A.

In a third display module 30E, the side member 100 may be positioned only on a side surface 45 corresponding to a right edge of the third display module 30E, like the first display module 30E, and in each of the fifth display module 30I and the seventh display module 30M, the side member 100 may also be positioned only on a side surface 45 corresponding to a right edge 31.

Accordingly, the side member 100 may be positioned in a gap G formed between the display modules 30A to 30P upon an arrangement of the display modules 30A to 30P.

The side member 100 may cover at least one portion of a metal plate 60 and at least one portion of a side cover 90 in the second direction Y.

For example, in the first display module 30A and the third display module 30E, a side member 100A may be positioned on a side surface 45 of the first display module 30A, the side surface 45 being adjacent to the third display module 30E in the second direction Y.

The side member 100A may be not positioned on a side surface 45 of the third display module 30E, the side surface 45 being adjacent to the first display module 30A in the second direction Y. Accordingly, the side member 100A of the first display module 30A may face a side 91E of a side cover 90 of the third display module 30E in such a way as to be in contact with the side 91E.

Accordingly, a spacing T between sides 91A and 91E of the first display module 30A and the third display module 30E may have a length corresponding to a thickness t of the side member 100.

Accordingly, the spacing T between the sides 91A and 91E of the first display module 30A and the third display module 30E may be reduced, which leads to a reduction of recognition of a seam between the first display module 30A and the third display module 30E.

However, the side member 100 may be positioned on the side surface 45 corresponding to the left edge 33, not the side surface 45 corresponding to the right edge 31. In this case, a side member 100 may be positioned on a side surface 45 corresponding to a left edge 33 of the third display module 30E between the first display module 30A and the third display module 30E, and the side member 100A of the first display module 30A may be not positioned between the first display module 30A and the third display module 30E.

As such, although only one side member 100A of the first display module 30A is positioned between the first display module 30A and the third display module 30E, current generated by an electrostatic discharge between the first display module 30A and the third display module 30E and entered the side cover 90E of the third display module 30E may be guided through the side member 100A of the first display module 30A being in contact with the side 91E of the side cover 90E of the third display module 30E, resulting in high reliability against ESD of the third display module 30E.

That is, although the side member 100A of the first display module 30A is positioned between the first and third display modules 30A and 30E being adjacent to each other in the second direction Y among the display modules 30A to 30P, both the first and third adjacent display modules 30A and 30E may be in contact with the side member 100A, and accordingly, reliability against ESD of both the first and third display modules 30A and 30E may be raised through the one side member 100A in spite of current generated by an electrostatic discharge between the first and third display modules 30A and 30E.

As described above, the first display module 30A may be positioned at a leftmost location of the display panel 20, and the side member 100A may be positioned only on the side surface 45 corresponding to the right edge 31 in the second direction Y. Accordingly, no side member 100 may be positioned on the left edge 33.

Also, in the third display module 30E, the fifth display module 30I, and the seventh display module 30M, the side member 100 may be not positioned on the side surfaces 45 corresponding to the left edges 33 of the third display module 30E, the fifth display module 30I, and the seventh display module 30M, and side members 100E, 100I, and 100M may be positioned respectively on the side surfaces 45 corresponding to the right edges 31 of the third display module 30E, the fifth display module 30I, and the seventh display module 30M.

In this case, although the side members 100E, 100I, and 100M of the third, fifth, and seventh display modules 30E, 30I, and 30M are not positioned on the side surfaces 45 corresponding to the left edges 33, the side members 100A, 100E, and 100I of the first, third, and fifth display modules 30A, 30E, and 30I being adjacent to the third, fifth, and seventh display modules 30E, 30I, and 30M in the second direction Y may be positioned on the side surfaces 45 corresponding to the left edges 33 of the third, fifth, and seventh display modules 30E, 30I, and 30M. Accordingly, reliability against ESD may be improved by the side members 100A, 100E, and 100I of the adjacent first, third, and fifth display modules 30A, 30E, and 30I although none of the side members 100E, 100I, and 100M is positioned on the side surfaces 45 corresponding to the left edges 33 of the third, fifth, and seventh display modules 30E, 30I, and 30M.

However, because there is no display module being adjacent to the side surface 45 corresponding to the left edge 33 of the first display module 30A in the second direction Y, current may enter the side surface 45 corresponding to the left edge 33 of the first display module 30A upon occurrence of an electrostatic discharge on the side surface 45 to damage the side wire 46 and the electronic components of the first display module 30A.

To prevent such damage, the display apparatus 1 according to an embodiment of the disclosure may include a frame side member 200 including a first frame side member 210 positioned on a frame 15, being in contact with the side surface 45 corresponding to the upper edge 32 of the first display module 30A supported on the frame 15, and grounded to the frame 15, and a second frame side member 220 being in contact with the side surface 45 corresponding to the left edge 33 and grounded to the frame 15.

The frame side member 200 according to the above-described embodiment of the disclosure may extend in the second direction Y at an area being adjacent to the upper edge of the frame 15, whereas, in the frame side member 200 according to another embodiment of the disclosure, the first frame side member 210 extending in the second direction Y at the area being adjacent to the upper edge of the frame 15 and the second frame side member 220 extending in the third direction Z at an area being adjacent to the left edge of the frame 15 may be positioned respectively on the frame 15.

The second frame side member 220 may extend in the third direction Z to cover all side surfaces 45 corresponding to left edges 33 of the second display module 30B, the fourth display module 30C, and the sixth display module 30D aligned with the first display module 30A in the third direction Z, as well as the first display module 30A.

That is, to protect the side surfaces 45 corresponding to the left edges 33 of the second display module 30B, the fourth display module 30C, and the sixth display module 30D in which no side member 100 is positioned on the side covers 90 formed on the side surfaces 45 corresponding to the left edges 33, as well as the first display module 30A, the frame side member 200 may cover at least one portions of the side covers 90 of the first, second, fourth, and sixth display modules 30A, 30B, 30C, and 30D.

Accordingly, as described above, although the side member 100 is positioned only on any one side surface 45 of a pair of side surfaces 45 on which the side wire 46 extends in each of the display modules 30A to 30P, ESD reliability of the other side surface 45 on which the side member 100 is not positioned may be improved by a side member 100 of another display module being adjacent to the corresponding display module in the second direction Y or the frame side member 200.

Also, because the side member 100 is positioned only on any one side 45 of the pair of side surfaces 45 on which the side wire 46 extends in each of the display modules 30A to 30P, a length of a gap G between display modules being adjacent to each other in the third direction Z may be reduced, resulting in a reduction of recognition of seams between the display modules 30A to 30P.

However, in a case in which the side member 100 is positioned on the side surface 45 corresponding to the left edge 33 of each of the display modules 30A to 30P in the second direction Y, instead of the right edge 31, the frame side member 200 may extend along the third direction Z at an area of the frame 15, being adjacent to the right edge 31.

In this case, the frame side member 200 may cover the side cover 90 formed on the side surface 45 corresponding to the right edge 31 of the seventh display module 30M, and side covers 90 formed on side surfaces 45 corresponding to right edges 31 of display modules 30N, 30O, and 30P aligned with the seventh display module 30M in the third direction Z.

The side member 100 positioned in the third direction Z and the side member 100 positioned in the second direction Y may be integrated into one body, and accordingly, the side member 100 may have a shape surrounding two neighboring side surfaces 45 among four side surfaces 45 of each of the display modules 30A to 30P.

For example, in the first display module 30A, the side member 100 may surround the side covers 90 formed on the side surfaces 45 corresponding to the right edge 31 and the lower edge 34.

The display apparatus according to an embodiment of the disclosure may be sealed by the front cover in the front direction of each display module, the side cover on the side surface of the display module, and the metal plate on the rear side of the display module, and ESD pressure resistance of the display apparatus may be improved by the side member additionally positioned on the side surface of the display module and grounded to the metal plate, against an electrostatic discharge that may occur in the display modules while the display modules are manufactured and conveyed and after the display modules are assembled into the display apparatus.

The display apparatus according to an embodiment of the disclosure may have a seamless effect by which a seam between display modules is invisible by improving an arrangement of the side members of the display modules to reduce gaps between the display modules.

So far, although the technical concept of the disclosure has been described based on specific embodiments, the scope of rights of the disclosure is not limited to these embodiments. It should be interpreted that various embodiments modified or changed by a person skilled in the art within a scope not deviating from the gist of the disclosure as the technical concept of the disclosure, which is defined in the claims, also belong to the scope of rights of the disclosure.

What is claimed is:
1. A display module comprising:
   a substrate having a mounting surface on which a plurality of inorganic light-emitting diodes are mounted and a TFT layer is formed, four side surfaces, and a rear surface being opposite to the mounting surface;

a side wiring electrically connected to the TFT layer and extending along a first pair of side surfaces among the four side surfaces of the substrate;
a front cover covering the TFT layer and the plurality of inorganic light emitting devices in a first direction;
a metal plate provided on the rear surface of the substrate;
a side cover covering the side wiring and the four side surfaces; and
a side member provided on a side of the side cover and grounded to the metal plate,
wherein the side member is provided on a first side surface of the first pair of side surfaces along which the side wiring extends among the four side surfaces.

2. The display module of claim 1, wherein the side member comprises a first side member provided on the first side surface of the first pair of side surfaces along which the side wiring extends, and a second side member provided on a second side surface of a second pair of side surface along which the side wiring does not extend among the four side surfaces.

3. The display module of claim 2, wherein the first side member and the second side member are integrally formed as one body and extend along the first side surface and the second side surface.

4. The display module of claim 1, wherein the side wiring extends along the four side surfaces, and
wherein the side member is provided on the first side surface of the first pair of side surfaces and a second side surface of a second pair of side surfaces among the four side surfaces.

5. The display module of claim 4, wherein the side member positioned on the first side surface and the second side surface is integrally formed as one body.

6. The display module of claim 1, wherein a conductivity of the side member is greater than a conductivity of the side cover.

7. The display module of claim 1, wherein a color of the side member is black.

8. The display module of claim 1, wherein the side member comprises a metal material.

9. A display apparatus comprising:
a plurality of display modules are arranged in an M*N matrix form; and
a frame configured to support the plurality of display modules,
wherein each display module of the plurality of display modules comprises:
  a substrate having a mounting surface on which a plurality of inorganic light-emitting diodes are mounted and a TFT layer is formed, four side surfaces, and a rear surface being opposite to the mounting surface;
  a side wiring electrically connected with the TFT layer and extending along a first pair of side surfaces among the four side surfaces;
  a front cover covering the plurality of inorganic light-emitting diodes and the TFT layer in a first direction;
  a metal plate provided on the rear surface;
  a side cover covering the side wiring and the four side surfaces; and
  a side member provided on a side of the side cover and grounded to the metal plate, and
wherein the side member is positioned on a first side surface of the first pair of side surfaces along which the side wiring extends among the four side surfaces.

10. The display apparatus of claim 9, wherein the plurality of display modules comprises a first display module and a second display module that is adjacent to the first display module in a direction in which the side wiring of the first display module is extends, and
wherein the side member of the first display module contacts a second side surface of the second display module among the first pair of side surfaces along which the side wiring of the second display module extends, and the side member of the second display module is not provided on the second side surface of the second display module.

11. The display apparatus of claim 10, wherein a first display module of the plurality of display modules is positioned such that a second side surface among the first pair of side surfaces along which the side wiring extends is adjacent to an edge of the frame, and the side member is not positioned on the second side surface, and
wherein the frame comprises a frame side member that surrounds the second side surface of the first display module among the first pair of side surfaces along which the side wiring extends.

12. The display apparatus of claim 11, wherein the frame side member extends along the edge of the frame.

13. The display apparatus of claim 9, wherein the side member comprises a first side member provided on the first side surface of the first pair of side surfaces along which the side wiring extends, and a second side member provided on a second side surface of a second pair of side surface along which the side wiring does not extend among the four side surfaces.

14. The display apparatus of claim 13, wherein the first side member and the second side member are integrally formed as one body and extend along the first side surface and the second side.

15. The display apparatus of claim 13, wherein each display module of the plurality of display modules is positioned such that side surfaces on which neither the first side member nor the second side member are positioned, among the four side surfaces, are respectively adjacent to edges of the frame, and
wherein the frame comprises a frame side member that surrounds the side surfaces of the each display module of the plurality of display modules, on which neither the first side member nor the second side member are provided.

* * * * *